US007145379B2

(12) United States Patent
Date et al.

(10) Patent No.: US 7,145,379 B2
(45) Date of Patent: Dec. 5, 2006

(54) CURRENT DRIVER AND DISPLAY DEVICE

(75) Inventors: Yoshito Date, Shiga (JP); Tetsuro Omori, Osaka (JP); Shiro Dosho, Osaka (JP); Makoto Mizuki, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 61 days.

(21) Appl. No.: 10/815,800

(22) Filed: Apr. 2, 2004

(65) Prior Publication Data

US 2005/0024100 A1 Feb. 3, 2005

(30) Foreign Application Priority Data

Jul. 29, 2003 (JP) ............................ 2003-281848

(51) Int. Cl.
*H03K 17/687* (2006.01)
*G09G 3/36* (2006.01)

(52) U.S. Cl. ........................................ 327/431; 345/90

(58) Field of Classification Search ........ 327/430–431, 327/427, 434, 437, 108, 112; 323/315; 345/90, 345/204

See application file for complete search history.

(56) References Cited

U.S. PATENT DOCUMENTS 5,596,372 A 1/1997 Berman et al. ............. 348/537
5,633,653 A 5/1997 Atherton
5,696,459 A 12/1997 Neugebauer et al.
5,748,044 A 5/1998 Xue ............................. 331/2
6,204,834 B1 3/2001 Baker et al. .................. 345/74
6,222,357 B1 4/2001 Sakuragi ..................... 323/315
6,456,270 B1 9/2002 Itakura ....................... 345/198
6,509,854 B1 1/2003 Morita et al.
6,586,888 B1 7/2003 Kitahara et al.
6,646,481 B1 11/2003 Blankenship et al.
6,765,560 B1 7/2004 Ozawa
6,777,885 B1 * 8/2004 Koyama .................. 315/169.1
6,882,186 B1 * 4/2005 Nishitoba ................... 327/108
6,897,619 B1 5/2005 Shimizu
6,858,742 B1 10/2005 Date et al.
2003/0067345 A1 4/2003 Blankenship et al.
2003/0151687 A1 8/2003 Hanada et al.
2003/0184566 A1 10/2003 Date et al. .................. 345/690
2005/0073513 A1 * 4/2005 Date .......................... 345/204

FOREIGN PATENT DOCUMENTS

JP 62-262517 11/1987
JP 05-216439 A 8/1993
JP 09-319323 12/1997
JP 11-205147 7/1999

(Continued)

*Primary Examiner*—My-Trang Nu Ton
(74) *Attorney, Agent, or Firm*—McDermott Will & Emery LLP

(57) ABSTRACT

The first and second chips are provided side by side. The first chip includes: a current supply section for outputting a drive current, the current supply section including a current mirror; a current distribution MISFET; a current input MISFET for transmitting an electric current to the current supply section, the current input MISFET being connected to the current distribution MISFET; and a second current distribution MISFET. The current distribution MISFET and the second current distribution MISFET constitute a current mirror. The second chip includes a second current input MISFET which is connected to the second current distribution MISFET. The ratio between the W/L ratio of the current distribution MISFET and the W/L ratio of the current input MISFET connected thereto is the same in the first and second chips.

26 Claims, 14 Drawing Sheets

FOREIGN PATENT DOCUMENTS

| | | | |
|---|---|---|---|
| JP | 11-340765 | | 12/1999 |
| JP | 2000-310981 | A | 11/2000 |
| JP | 2002-202823 | A | 7/2002 |

* cited by examiner

CURRENT DRIVER AND DISPLAY DEVICE

CROSS-REFERENCE TO RELATED APPLICATION

This nonprovisional application claims priority under 35 U.S.C. §119(a) on Japanese Patent Application No. 2003-281848, the entire contents of which are hereby incorporated by reference.

BACKGROUND OF THE INVENTION

1. Field of the Invention

The present invention relates to a current driver and particularly to a technology of current drivers suitable as a display driver for a display device, such as an organic EL (electroluminescent) panel, and the like.

2. Description of the Prior Art

In recent years, in the fields of flat panel displays, such as organic EL panels, and the like, the screen size and definition have been increasing while the thickness, weight and production cost have been decreasing. In general, the active matrix method has been favorably employed as a method for driving a large, high-definition display panel. Hereinafter, a display driver for a conventional active matrix display panel is described.

FIG. 14 is a circuit diagram showing the structure of a display panel and a conventional current driver connected to the display panel. In the example of FIG. 14, the current driver is a display driver. The display panel is an organic EL panel.

Referring to FIG. 14, the conventional current driver includes current supply sections 1001*a*1, 1001*a*2, . . . and 1001*an* (hereinafter, referred to as "current supply section(s) 1001*a*" when generically mentioned) for supplying driving currents respectively to a plurality of pixel circuits 1005*a*1, 1005*a*2, . . . and 1005*am* (hereinafter, referred to as "pixel circuit(s) 1005*a*", when generically mentioned) which are arranged in a matrix over the display panel, and a reference current supply section (bias circuit) 1101 for supplying the reference current to the current supply sections 1001*a*. In the present specification, the "reference current" means an electric current having a predetermined value, which is supplied from a reference current source. The "reference current" also means an electric current derived from the reference current source and transmitted by a current mirror circuit.

In the case of a device having a large size display panel, such as a television display device, a plurality of semiconductor chips (driver LSI chips) 1105 in which current supply sections 1001*a* having m output terminals are integrated are used for driving the display panel. In many cases, these semiconductor chips 1105 are aligned in a line at a peripheral portion of the display panel.

Each of the pixel circuits 1005*a*1, 1005*a*2, . . . and 1005*am* includes a first TFT (Thin Film Transistor) 1104 of p-channel type, which is connected to the current supply section 1001*a* through a signal line, a second TFT 1102, and an organic EL element 1103 which emits light according to an electric current supplied from the second TFT 1102. The first TFT 1104 and second TFT 1102 constitute a current mirror circuit.

The reference current supply section 1101 includes: a first MISFET 1108 of p-channel type, one end of which being supplied with a supply voltage; a resistor 1107 for generating a reference current, which is connected to the first MISFET 1108; a second MISFET 1109 of p-channel type; and a current input MISFET 1110 of n-channel type for transmitting the reference current to the current supply sections 1001*a*, which is connected to the second MISFET 1109. The first MISFET 1108 and second MISFET 1109 constitute a current mirror circuit. In the example of FIG. 14, the reference current supply section 1101 is provided outside the semiconductor chips 1105. However, the reference current supply section 1101 may be provided on the semiconductor chip 1105. In this specification, in an example where a plurality of semiconductor chips 1105 are provided in a display device, a semiconductor chip for supplying the reference current to the other semiconductor chips is referred to as "master chip" while the semiconductor chips which receive the reference current from the "master chip" are referred to as "slave chips".

In a system where n-bit scale is controlled, each of the current supply sections 1001*a* includes current sources 1112-1, 1112-2, . . . and 1112-*n* (n is a positive integer) arranged in parallel to each other with respect to an output section that is connected to the pixel circuit 1005*a*, and switches 1115-1, 1115-2, . . . and 1115-*n* for controlling the on/off states of the electric current flowing through the current sources 1112-1, 1112-2, . . . and 1112-*n*. Herein, each of the current sources 1112-1, 1112-2, . . . and 1112-*n* is formed by an n-channel type MISFET. This n-channel type MISFET and the current input MISFET 1110 constitute a current mirror circuit. Each of the switches 1115-1, 1115-2, . . . and 1115-*n* independently carries out the switching operation according to display data.

With the above-described structure, the operation of a display device driven by an electric current is controlled.

SUMMARY OF THE INVENTION

However, in the display device having the above-described structure, a defect of image display, such as display unevenness, or the like, is sometimes seen during the display of images. In these years, the screen size of the display panel has been increasing, and accordingly, it is necessary to provide a larger number of driver LSI chips having a longitudinal length of 10 mm to 20 mm as compared with a conventional display panel. In such a case, in a semiconductor chip including a conventional current driver, there is a possibility that a variation occurs among the output currents from output terminals which are distant from each other, and as a result, deterioration in the image quality, such as uneven brightness in a displayed image, or the like, is caused. Especially, a larger variation in the output currents occurs between output terminals of different semiconductor chips 1105 rather than between output terminals of the same semiconductor chip 1105.

The present inventors examined the reasons for the variation among the output voltages at the output terminals of one driver LSI chip (semiconductor chip) for a display device and found that a variation occurs among the electric currents distributed to MISFETs which constitute the current sources 1112 on the semiconductor chip 1105 (see FIG. 14).

A current mirror circuit is originally designed under prerequisites that the dispersion condition of transistors constituting the current mirror circuit are the same, and no significant difference occurs in threshold value Vt or in the carrier mobility between the transistors. In the presence of such prerequisites, the electric current is distributed according to the size ratio of the transistors. However, in the case where the length of the driver LSI chips for a display device is as long as 10 mm to 20 mm, it is considered to be difficult to uniformly disperse impurities in the transistors. Furthermore, if the positions of the transistors are different, a variation in the production process, such as an etching variation, occurs and accordingly a variation in display can also be caused. As a result, a variation occurs among the threshold values of transistors which constitute a current mirror. In the case where a variation occurs among the threshold values of the transistors, an error occurs in the output current when the same gate voltage is applied to the transistors. In general cases, a variation in the dispersion is gradient over a wafer surface. Thus, even when uniform display is carried out based on certain display data, a gradation from darker portions to brighter portions occurs over the display panel.

Furthermore, a variation occurs in the current value among electric currents output from current drivers on different semiconductor chips. In many display devices, the production conditions, such as the dispersion condition, and the like, are different among a plurality of semiconductor chips arranged side by side. Therefore, a variation in the characteristics among the MISFETs which constitute the current sources of the current supply section **1001*a*1 is greater than that caused in the same chip, and accordingly, uneven display corresponding to respective semiconductor chips 1105 is likely to be seen. We thus concluded that suppressing a variation in output currents from an output terminal among the semiconductor chips 1105** is the most effective solution to suppress uneven display over a display panel.

An objective of the present invention is to provide a current driver capable of suppressing a variation in the output currents among a plurality of driver LSI chips that drive a display device, and a display device including such a current driver.

The first current driver of the present invention is a current driver integrated on a semiconductor chip, comprising: a first current distribution MISFET of a first conductivity type, a source of the first current distribution MISFET being supplied with a supply voltage; a first current input MISFET of a second conductivity type, a drain of the first current input MISFET being connected to a drain of the first current distribution MISFET, the drain and a gate electrode of the first current input MISFET being connected to each other; a second current input MISFET of a second conductivity type, the second current input MISFET and the first current input MISFET constituting a current mirror circuit, a drain and a gate electrode of the second current input MISFET being connected to each other; a first bias line for connecting the gate electrode of the first current input MISFET and the gate electrode of the second current input MISFET; a plurality of current supply sections each including a current source MISFET, the current source MISFET, the first current input MISFET and the second current input MISFET constituting a current mirror circuit, a gate electrode of the current source MISFET being connected to the first bias line; a second current distribution MISFET of the first conductivity type, the second current distribution MISFET and the first current distribution MISFET constituting a current mirror circuit, a drain of the second current distribution MISFET being connected to the drain of the second current input MISFET; a third current distribution MISFET provided adjacent to the second current distribution MISFET, the third current distribution MISFET, the first current distribution MISFET and the second current distribution MISFET constituting a current mirror circuit; and a first current output terminal which is connected to a drain of the third current distribution MISFET.

With the above structure, in a display device, for example, the third current distribution MISFET is connected to a current input MISFET on a neighboring semiconductor chip, whereby an error in the output current at a connecting portion between the adjoining semiconductor chips is reduced as compared with a case where the third current distribution MISFET and the current input MISFET are on the same chip.

The second current driver of the present invention is a current driver integrated on a semiconductor chip, comprising: a first current input terminal; a first current input MISFET of a first conductivity type, a drain of the first current input MISFET being connected to the first current input terminal, and the drain and gate electrode of the first current input MISFET being connected to each other; a plurality of current supply sections including current source MISFETs of the first conductivity type, the current source MISFETs and the first current input MISFET constituting a current mirror circuit; and a bias line which is commonly connected to the gate electrode of the first current input MISFET and the gate electrodes of the current source MISFETs.

For example, the second current driver having the above structure is connected to the first current driver of the present invention, whereby the output current from the current supply section is uniform between the semiconductor chips.

The third current driver of the present invention is a current driver integrated on a semiconductor chip, comprising: a first current distribution MISFET of a first conductivity type, a source of the first current distribution MISFET being supplied with a supply voltage; a current input MISFET of a second conductivity type, a drain of the current input MISFET being connected to a drain of the first current distribution MISFET, the drain and gate electrode of the current input MISFET being connected to each other; a current input/output MISFET of the second conductivity type, a drain and gate electrode of the current input/output MISFET being connected to each other, the current input/output MISFET and the current input MISFET constituting a current mirror circuit; a first bias line for connecting the gate electrode of the current input MISFET and the gate electrode of the current input/output MISFET; a plurality of current supply sections including current source MISFETs, gate electrodes of the current source MISFETs being connected to the first bias line, the current source MISFETs, the current input MISFET and the current input/output MISFET constituting a current mirror circuit; a second current distribution MISFET of the first conductivity type, a drain of the second current distribution MISFET being connected to the drain of the current input/output MISFET; a current-voltage converter connected to at least the gate electrode and source of the second current distribution MISFET and provided in a region of the semiconductor chip which is distant from the second current distribution MISFET by 200 μm or less; and a current input/output terminal which is connected to the current-voltage converter.

In a display device including the third current driver, for example, a current-voltage converter provided on a neighboring chip is connected in series to the current-voltage converter of the present invention so that substantially-equal electric currents flow through adjoining current input MISFETs.

The first display device of the present invention is a display device comprising a first semiconductor chip which includes a first current driver and a second semiconductor chip which include a second current driver and is provided adjacent to the first semiconductor chip, wherein: the first current driver includes a first current distribution MISFET of a first conductivity type, a source of the first current distribution MISFET being supplied with a supply voltage, a first current input MISFET of a second conductivity type, a drain of the first current input MISFET being connected to a drain of the first current distribution MISFET, the drain and a gate electrode of the first current input MISFET being connected to each other, a second current input MISFET of the second conductivity type, the second current input MISFET and the first current input MISFET constituting a current mirror circuit, a drain and a gate electrode of the second current input MISFET being connected to each other, a first bias line for connecting the gate electrode of the first current input MISFET and the gate electrode of the second current input MISFET, a plurality of first current supply sections each including a first current source MISFET, the first current source MISFET, the first current input MISFET and the second current input MISFET constituting a current mirror circuit, a gate electrode of the first current source MISFET being connected to the first bias line, a second current distribution MISFET of the first conductivity type, the second current distribution MISFET and the first current distribution MISFET constituting a current mirror circuit, a drain of the second current distribution MISFET being connected to the drain of the second current input MISFET, a third current distribution MISFET provided in a region which is distant from the second current distribution MISFET by 200 μm or less, the third current distribution MISFET, the first current distribution MISFET and the second current distribution MISFET constituting a current mirror circuit, and a first current output terminal which is connected to a drain of the third current distribution MISFET; and the second current driver includes a first current input terminal which is connected to the first current output terminal, a third current input MISFET of the second conductivity type, a drain of the third current input MISFET being connected to the first current input terminal, and the drain and gate electrode of the third current input MISFET being connected to each other, a plurality of second current supply sections including second current source MISFETs, the second current source MISFETs and the third current input MISFET constituting a current mirror circuit, and a second bias line which is commonly connected to the gate electrode of the third current input MISFET and the gate electrodes of the second current source MISFETs.

With the above structure, an electric current is supplied from the third current distribution MISFET on the first semiconductor chip to the third current input MISFET at the next stage. Thus, a variation among the output currents in each chip is suppressed as compared with a conventional structure.

The second display device of the present invention is a display device comprising a first semiconductor chip which includes a first current driver and a second semiconductor chip which include a second current driver and is provided adjacent to the first semiconductor chip, wherein: the first current driver includes a first current distribution MISFET of a first conductivity type, a source of the first current distribution MISFET being supplied with a supply voltage, a first current input MISFET of a second conductivity type, a drain of the first current input MISFET being connected to a drain of the first current distribution MISFET, the drain and gate electrode of the first current input MISFET being connected to each other, a current input/output MISFET of the second conductivity type, a drain and gate electrode of the current input/output MISFET being connected to each other, the current input/output MISFET and the first current input MISFET constituting a current mirror circuit, a first bias line for connecting the gate electrode of the first current input MISFET and the gate electrode of the current input/output MISFET, a plurality of first current supply sections including current source MISFETs, gate electrodes of the current source MISFETs being connected to the first bias line, the current source MISFETs, the first current input MISFET and the current input/output MISFET constituting a current mirror circuit, a second current distribution MISFET of the first conductivity type, a drain of the second current distribution MISFET being connected to the drain of the current input/output MISFET, a first current-voltage converter connected to the gate electrode and source of the second current distribution MISFET and a reference power supply and provided in a region of the semiconductor chips which is distant from the second current distribution MISFET by 200 μm or less, and a current input/output terminal which is connected to the first current-voltage converter, the second current driver includes a current input terminal which is connected to the current input/output terminal, a second current-voltage converter which is connected in series to the first current-voltage converter through the current input terminal, a third current distribution MISFET of the first conductivity type, a source and gate electrode of the third current distribution MISFET being connected to the second current-voltage converter, a second current input MISFET of the second conductivity type which is connected to the drain of the third current distribution MISFET, and a plurality of second current supply sections including second current source MISFETs, the second current source MISFETs and the second current input MISFET constituting a current mirror circuit.

With the above structure, substantially-equal electric currents flow through the first current-voltage converter and the second current-voltage converter. Thus, an error in the output current is suppressed at least in the vicinity of a connecting portion between adjoining semiconductor chips.

The third display device of the present invention is a display device comprising a first semiconductor chip which includes a first current driver and a second semiconductor chip which include a second current driver and is provided adjacent to the first semiconductor chip, wherein: the first current driver includes a first current distribution MISFET of a first conductivity type, a source of the first current distribution MISFET being supplied with a supply voltage, a first current input MISFET of a second conductivity type, a drain of the first current input MISFET being connected to a drain of the first current distribution MISFET, the drain and gate electrode of the first current input MISFET being connected to each other, a current input/output MISFET of the second conductivity type, a drain and gate electrode of the current input/output MISFET being connected to each other, the current input/output MISFET and the current input MISFET constituting a current mirror circuit, a first bias line for connecting the gate electrode of the first current input MISFET and the gate electrode of the current input/output MISFET, a plurality of first current supply sections including first current source MISFETs, gate electrodes of the first current source MISFETs being connected to the first bias line, the first current source MISFETs, the first current input MISFET and the current input/output MISFET constituting a current mirror circuit, a second current distribution MISFET of the first conductivity type, a drain of the second current distribution MISFET being connected to the drain of the current input/output MISFET, a first current-voltage converter connected to the gate electrode and source of the second current distribution MISFET and a reference power supply and provided in a region of the first semiconductor chip which is distant from the second current distribution MISFET by 200 μm or less, a first current input terminal which is connected to the first current-voltage converter, a first load circuit provided in a region of the first semiconductor chip which is distant from the first current-voltage converter by 200 μm or less, and a first current output terminal which is connected to the load circuit; and the second current driver includes a second current output terminal which is connected to the first current input terminal, a second load circuit which is connected in series to the first current-voltage converter through the first current input terminal, a second current input terminal which is connected to the first current output terminal, a second current-voltage converter which is connected in series to the first load circuit through the first current output terminal, a third current distribution MISFET of the first conductivity type, a source and gate electrode of the third current distribution MISFET being connected to the second current-voltage converter, a second current input MISFET of the second conductivity type which is connected to a drain of the third current distribution MISFET, and a plurality of second current supply sections including second current source MISFETs, the second current source MISFETs and the second current input MISFET constituting a current mirror circuit.

With the above structure, the values of the electric currents flowing through the first current-voltage converter and the second current-voltage converter are precisely adjusted to be equal. Thus, the output currents (electric currents for driving a panel) are uniform at least in the vicinity of a connecting portion of the semiconductor chips.

DESCRIPTION OF THE PREFERRED EMBODIMENTS

Figure 1:
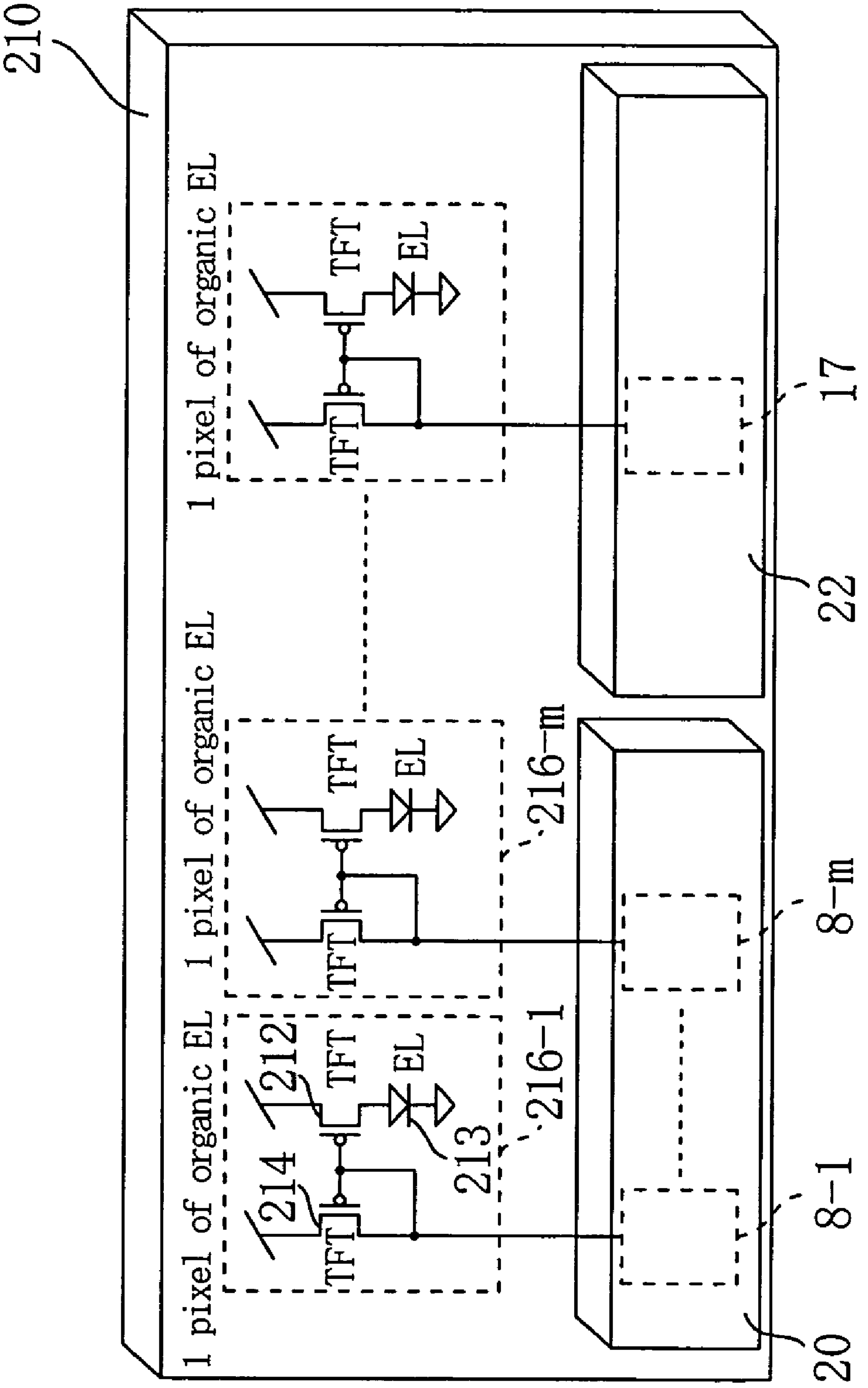
FIG. 1 is a circuit diagram schematically showing an organic EL display device including current drivers according to the present invention.

FIG. 1 is a circuit diagram schematically showing an organic EL display device 210 including current drivers according to the present invention.

Referring to FIG. 1, the organic EL display device 210 includes a display panel, pixel circuits 216-1, 216-2, . . . and **216-*m* arranged in a matrix over the display panel, a first semiconductor chip 20, and a second semiconductor chip 22 provided adjacent to the first semiconductor chip 20. The first semiconductor chip 20 has a first current driver including first current supply sections 8-1, 8-2, . . . and 8-*m* (hereinafter, referred to as "first current supply section(s) 8" when generically mentioned) for respectively supplying driving currents through signal lines to the pixel circuits 216-1, 216-2, . . . and 216-*m* (hereinafter, referred to as "pixel circuit(s) 216" when generically mentioned). The second semiconductor chip 22 has a second current driver including a second current supply section 17 for supplying a driving current to the pixel circuit 216. In the example illustrated in FIG. 1, the first semiconductor chip 20 is a master chip for transmitting a reference current to the second semiconductor chip 22 which is a slave chip. In the display device of the present invention, the first semiconductor chip 20 and the second semiconductor chip 22 may have different circuit structures so long as an electric current transmitted from the first current driver on the first semiconductor chip 20 to the second current driver on the second semiconductor chip 22** is substantially equal to the reference current.

Each semiconductor chip, which includes a current driver of the present invention, has an elongated shape whose longitudinal length is equal to or longer than 10 mm and equal to or shorter than 20 mrn. The number of output terminals of each current driver, m, is 528, for example. Although only the first semiconductor chip 20 and the second semiconductor chip 22 are shown in FIG. 1, a large number of semiconductor chips which are supplied with an electric current substantially equal to the reference current flowing through the current drivers of the first semiconductor chip 20 and the second semiconductor chip 22 may further be provided in some cases.

Hereinafter, embodiments of the current driver of the present invention are described with reference to the drawings.

Embodiment 1

Figure 2:
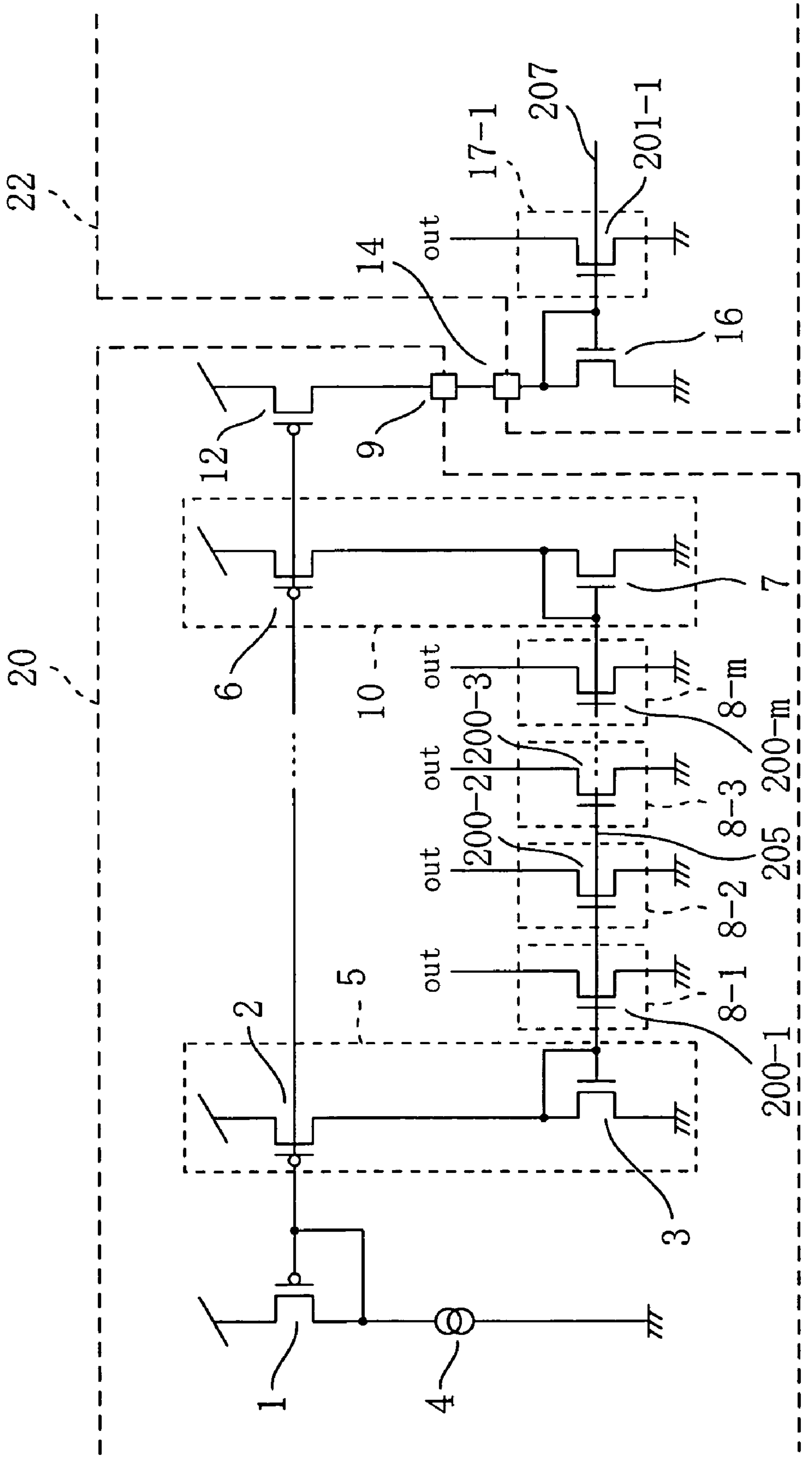
FIG. 2 is a circuit diagram showing semiconductor chips which include current drivers according to embodiment 1 of the present invention.
Figure 14:
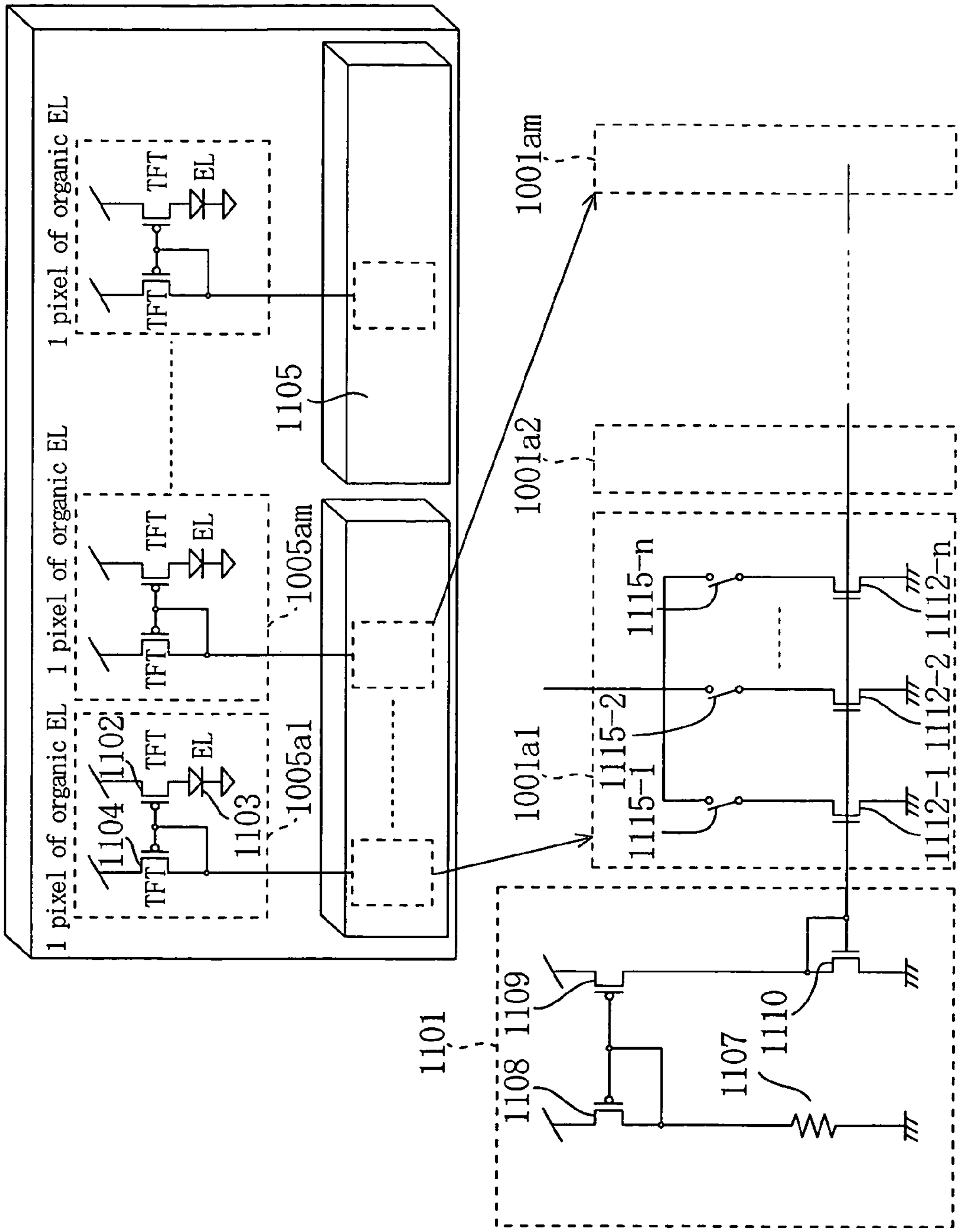
FIG. 14 PRIOR ART
FIG. 14 is a circuit diagram schematically showing a structure of a general organic EL display device.

FIG. 2 is a circuit diagram showing semiconductor chips which include current drivers according to embodiment 1 of the present invention. The current drivers shown in FIG. 2 are used as source drivers of a current-driven display device, such as an organic EL display device, an LED display device, or the like, as are the current drivers of FIG. 14. In the example of FIG. 2, the first semiconductor chip 20 is a master chip, and the second semiconductor chip 22 provided adjacent to the first semiconductor chip 20 is a slave chip. These two chips are provided in the display device.

A first current driver is provided on the first semiconductor chip 20 of embodiment 1. The first current driver includes a plurality of first current supply sections 8, a reference current supply section for supplying the drive current (reference current) to the first current supply sections 8, a first bias circuit 5, a second bias circuit 10, a first current distribution MISFET 12, and a first current output terminal 9 connected to the first current distribution MISFET 12. The first current supply sections 8 include first current source MISFETs 200 of n-channel type. Gate electrodes of the first current source MISFETs 200 are commonly connected to a first bias line 205. The first bias circuit 5 transmits an electric current generated in the reference current supply section to the first current supply sections 8 at the side of the first current supply section 8-1. The second bias circuit 10 transmits the electric current generated in the reference current supply section to the first current supply sections 8 at the side of the first current supply section **8-*m*. The first current distribution MISFET 12 transmits the reference current to the second semiconductor chip 22**.

The reference current supply section includes a first current source 4 and a first MISFET 1 of p-channel type. One end of the first current source 4 is grounded. The source and gate electrode of the first MISFET 1 are connected to the first current source 4. The drain of the first MISFET 1 is supplied with the supply voltage. In embodiment 1, the supply voltage is, for example, about 5 V.

The first bias circuit 5 includes a second current distribution MISFET 2 of p-channel type and a first current input MISFET 3 of n-channel type. The source of the second current distribution MISFET 2 is supplied with the supply voltage. The second current distribution MISFET 2 and the first MISFET 1 constitute a current mirror circuit. The drain and gate electrode of the first current input MISFET 3 are connected to each other. The drain of the first current input MISFET 3 is connected to the second current distribution MISFET 2. The gate electrode of the first current input MISFET 3 is connected to the first bias line 205. The source of the first current input MISFET 3 is grounded.

The second bias circuit 10 has the same structure as that of the first bias circuit 5. The second bias circuit 10 includes a third current distribution MISFET 6 of p-channel type and a second current input MISFET 7 of n-channel type. The third current distribution MISFET 6, the first MISFET 1 and the second current distribution MISFET 2 constitute a current mirror circuit. The drain and gate electrode of the second current input MISFET 7 are connected to each other. The drain of the second current input MISFET 7 is connected to the third current distribution MISFET 6. The gate electrode of the second current input MISFET 7 is connected to the first bias line 205. The source of the second current input MISFET 7 is grounded. The second bias circuit 10 and the first bias circuit 5 are designed such that the electric currents (reference currents) input to the first current input MISFET 3 and the second current input MISFET 7 are equal to each other. Specifically, the second bias circuit 10 and the first bias circuit 5 are designed such that a/b=c/d is satisfied where a is the W/L ratio of the second current distribution MISFET 2, b is the W/L ratio of the first current input MISFET 3, c is the W/L ratio of the third current distribution MISFET 6, and d is the W/L ratio of the second current input MISFET 7. Herein, "W" of the W/L ratio is the gate width of a MISFET, and "L" of the W/L ratio is the gate length of a MISFET.

Each of the first current supply sections 8-1, 8-2, . . . and **8-*m* is a current mode D/A converter which outputs an electric current to a signal line of the panel. In FIG. 2, each of the first current supply sections 8-1, 8-2, . . . and 8-*m* includes the respective one of first current source MISFETs 200-1, 200-2, . . . and 200-*m*. However, in an actual semiconductor chip, each of the first current source MISFETs 200-1, 200-2, . . . and 200-*m* includes $2^n$-1 MISFETs, where n is the number of bits for display and, for example, 6. It should be noted that the first current source MISFETs 200-1, 200-2, . . . and 200-*m* are referred to as "first current source MISFET(s) 200**" when generically mentioned.

A feature of the first current driver having the above structure is that the first current distribution MISFET 12 and the first current output terminal 9 are provided in the vicinity of the third current distribution MISFET 6. The first current distribution MISFET 12 supplies the reference current to the adjoining second semiconductor chip 22 from the drain side. The first current output terminal 9 is connected to the drain of the first current distribution MISFET 12. Herein, the distance between the third current distribution MISFET 6 and the first current distribution MISFET 12 is such that a variation in the electric characteristics due to dispersion of impurities, or the like, causes no problem between the MISFETs 6 and 12. This distance varies according to the conditions and steps of production. The allowable distance is 200 μm or shorter. In general, the distance of 100 μm or shorter is especially preferable.

A second current driver is provided on the second semiconductor chip 22. The second current driver includes a first current input terminal 14, a third current input MISFET 16 of n-channel type, and second current supply sections 17-1, 17-2, . . . **17-*m* (only a part of them is shown). The first current input terminal 14 is provided in part of the second semiconductor chip 22 which adjoins the first semiconductor chip 20. The first current input terminal 14 is connected to the first current output terminal 9. The drain and gate electrode of the third current input MISFET 16 are connected to the first current input terminal 14 and a second bias line 207. The source of the third current input MISFET 16 is grounded. The second current supply sections 17-1, 17-2, . . . 17-*m* includes the respective one of second current source MISFETs 201-1, 201-2, . . . and 201-*m* (hereinafter, referred to as "second current source MISFET(s) 201" when generically mentioned). The gate electrodes of the second current source MISFETs 201-1, 201-2, . . . and 201-*m* are commonly connected to the second bias line 207. A feature of the second current driver is that a/b=c/d=e/f is substantially satisfied where f is the W/L ratio of the third current input MISFET 16, and e is the W/L ratio of the first current distribution MISFET 12**.

With the above structure, during the operation of the display device, an electric current which is equal to the electric currents input to the first current input MISFET 3 and the second current input MISFET 7 is input to the third current input MISFET 16 through the first current output terminal 9 and the first current input terminal 14. In other words, with the above structure, a current mirror is used to allow an electric current substantially equal to the currents flowing through the first bias circuit 5 and the second bias circuit 10 to flow through a bias circuit formed by the first current distribution MISFET 12 and the third current input MISFET 16. The third current distribution MISFET 6 and the first current distribution MISFET 12 are provided in the same chip and in the vicinity of each other and therefore have similar electric characteristics. Thus, electric currents input to the current input MISFETs are more uniform among semiconductor chips as compared with a conventional structure where the first current distribution MISFET 12 is provided on the second semiconductor chip 22.

In the display device of embodiment 1, an electric current generated in a reference current supply section of the first semiconductor chip 20 is transmitted to the third current input MISFET 16 of n-channel type through a current mirror circuit. Thus, the electric currents to be transmitted are uniform among the semiconductor chips as compared with a structure where, for example, the gate electrodes of the third current distribution MISFET 6 and the first current distribution MISFET 12 are not connected to the gate electrodes of the first MISFET 1 and the second current distribution MISFET 2 (i.e., no current mirror is structured). For the above reasons, in the display device of embodiment 1, a variation between the electric current output from a current supply section of the first semiconductor chip 20 and the electric current output from a current supply section of the second semiconductor chip 22 is small. Thus, flicker and unevenness in the display are suppressed.

In addition to suppression of the variation in the output currents among the semiconductor chips, the variation among the output currents in one chip is also suppressed in the first current driver. This is because the gate electrodes and drains of the first current input MISFET 3 and the second current input MISFET 7 are connected to the both ends of the first bias line 205.

Although not shown in FIG. 2, resistors having the same resistance value may be provided on the first bias line 205 between the gate electrodes of the first current input MISFET 3 and the first current source MISFET 200-1, between the gate electrodes of neighboring first current source MISFETs 200, and between the gate electrodes of the first current source MISFET 200-*m* and the second current input MISFET 7.

As described above, the threshold values of the serially-provided first current source MISFETs 200 are gradually different due to a variation in the dispersion step, or the like, even in the same chip. In the first current driver of embodiment 1, one end of the first bias line 205 is connected to the first bias circuit 5, and the other end is connected to the second bias circuit 10. The MISFETs that constitute the first bias circuit 5 and the MISFETs that constitute the second bias circuit 10 have different threshold values as do the first current source MISFETs 200. Thus, according to the structure of embodiment 1, a potential gradient is given to the first bias line 205, whereby the effects caused by the gradient in the threshold values of the first current source MISFETs 200 are canceled, and a variation among the output currents in the semiconductor chip is suppressed.

In the example described herein, a current output terminal for transmitting the reference current to a semiconductor chip at the next stage is not provided in the second semiconductor chip 22. Thus, the combination of the first semiconductor chip 20 and second semiconductor chip 22 of embodiment 1 is preferably used in a cellular mobile phone having a relatively small screen, or the like. However, a large number of the same semiconductor chips can be cascade-connected by making some modification to the terminal structure of the first semiconductor chip 20. For example, consider a case where, in the first current driver shown in FIG. 2, a terminal a is provided between the first MISFET 1 and the first current source 4, and a terminal b which is equivalent to the first current input terminal 14 and connected to a line between the second current distribution MISFET 2 and the first current input MISFET 3 is further provided. In this case, when this semiconductor chip is employed as a master chip, the first current source 4 is connected to the terminal a while the terminal b is left open. In the case where this semiconductor chip is used as a slave chip, the terminal a is open while the terminal b is connected to the first current output terminal 9 of the chip at the previous stage. With such a structure, in a display device, a panel is driven using a large number of the same type of chips, and therefore, the production cost is suppressed as compared with a case where two or more types of chips are used. In addition, a large screen display device with suppressed display unevenness is realized.

In a current driver of embodiment 1, the first current output terminal 9 and the first current input terminal 14 are preferably provided in the vicinity of each other so as to face each other. However, the current driver operates even when the terminals are not provided in the vicinity of each other.

The first and second current drivers of embodiment 1 operate even when the conduction types of MISFETs that constitute a circuit are all inverted. In this case, it is only necessary to exchange the power supply and the ground. This also applies to the embodiments described below.

Embodiment 2

Figure 3:
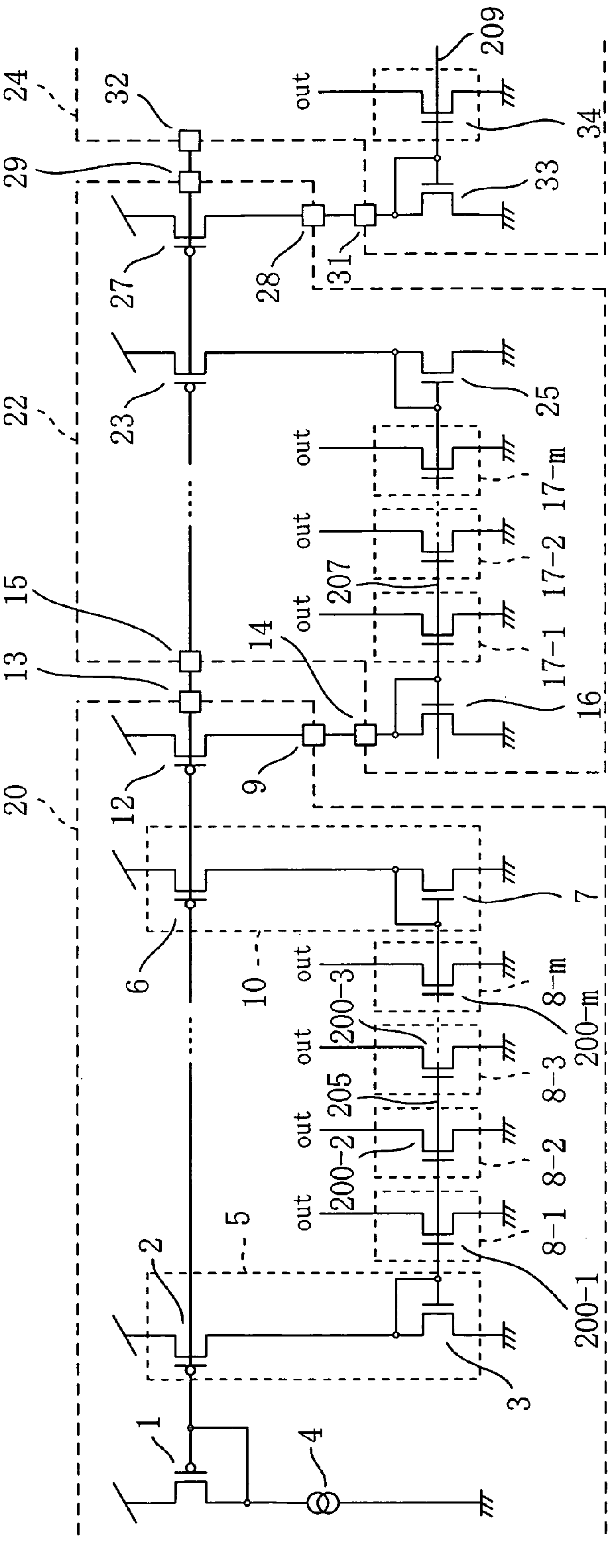
FIG. 3 is a circuit diagram showing semiconductor chips which include current drivers according to embodiment 2 of the present invention.

FIG. 3 is a circuit diagram showing semiconductor chips which include current drivers according to embodiment 2 of the present invention. In FIG. 3, a first semiconductor chip 20, a second semiconductor chip 22 and a third semiconductor chip 24 are a master chip, a first slave chip, and a second slave chip, respectively, which are arranged in a line.

In embodiment 2, a current driver structure for performing current transmission equivalent to that described in embodiment 1 among three or more semiconductor chips is described. In FIG. 3, like elements are denoted by like reference numerals used in FIGS. 1 and 2 of embodiment 1, and descriptions thereof are herein omitted.

The first current driver is provided on the first semiconductor chip 20. The second current driver is provided on the second semiconductor chip 22. The third current driver is provided on the third semiconductor chip 24. The second semiconductor chip 22 and the third semiconductor chip 24 have the same structure.

Referring to FIG. 3, the first current driver includes m first current supply sections 8, a reference current supply section for supplying a drive current to the first current supply section 8, a first bias circuit 5, a second bias circuit 10, a first current distribution MISFET 12, a first current output terminal 9 connected to the first current distribution MISFET 12, and a first bias power supplying terminal 13. The first current supply sections 8 include a plurality of first current source MISFETs 200 of n-channel type. The gate electrodes of the first current supply sections 8 are commonly connected to the first bias line 205. The first bias circuit 5 transmits an electric current generated in the reference current supply section to the first current supply sections 8 at the side of the first current supply sections 8-1. The second bias circuit 10 transmits the electric current generated in the reference current supply section to the first current supply sections 8 at the side of the first current supply sections 8-*m*. The first current distribution MISFET 12 transmits the reference current to the second semiconductor chip 22. The first bias power supplying terminal 13 is connected to the gate electrodes of the first MISFET 1, the first current distribution MISFET 12, the second current distribution MISFET 2, and the third current distribution MISFET 6. That is, the first current driver of embodiment 2 is different from the first current driver of embodiment 1 only in that the first current driver of embodiment 2 includes the first bias power supplying terminal 13.

The second current driver of embodiment 2 includes, in addition to the components of the second current driver of embodiment 1, a first bias power input terminal 15 connected to the first bias power supplying terminal 13, a fourth current distribution MISFET 23 of p-channel type, a fourth current input MISFET 25 of n-channel type, a fifth current distribution MISFET 27 of p-channel type which is provided in the vicinity of the fourth current distribution MISFET 23, a second current output terminal 28 connected to the drain of the fifth current distribution MISFET 27, and a second bias power supplying terminal 29 connected to the gate electrodes of the fourth current distribution MISFET 23 and the fifth current distribution MISFET 27. The gate electrode of the fourth current distribution MISFET 23 is connected to the first bias power input terminal 15. The fourth current distribution MISFET 23, the first MISFET 1, the first current distribution MISFET 12, the second current distribution MISFET 2, and the third current distribution MISFET 6 constitute a current mirror circuit. The drain and gate electrode of the fourth current input MISFET 25 are connected to each other. The drain of the fourth current input MISFET 25 is connected to the drain of the fourth current distribution MISFET 23. The gate electrode of the fourth current input MISFET 25 is connected to the second bias line 207. The fifth current distribution MISFET 27 and the fourth current distribution MISFET 23 constitute a current mirror circuit. The distance between the fourth current distribution MISFET 23 and the fifth current distribution MISFET 27 varies according to the design. The allowable distance is 200 μm or shorter. In general, the distance of 100 μm or shorter is especially preferable.

The ratio e/f, where e is the W/L ratio of the first current distribution MISFET 12 and f is the W/L ratio of the third current input MISFET 16, is equal to the ratio g/h, where g is the W/L ratio of the fourth current distribution MISFET 23 and h is the W/L ratio of the fourth current input MISFET 25. Furthermore, the ratio i/j, where i is the W/L ratio of the fifth current distribution MISFET 27 and j is the W/L ratio of the fifth current input MISFET 33, is also equal to the ratios e/f and g/h. Thus, in the case where the second semiconductor chip 22 and the third semiconductor chip 24 have the same structure, the value of i/j is equal to e/f and g/h.

The third semiconductor chip 24 has the same structure as that of the second semiconductor chip 22. In FIG. 3, a second bias power input terminal 32 which is connected to the second bias power supplying terminal 29 corresponds to the first bias power input terminal 15. A second current input terminal 31 which is connected to the second current output terminal 28 corresponds to the first current input terminal 14.

In the first and second current drivers of embodiment 2, the gate bias of the current distribution MISFET is supplied from the first current driver to the second current driver through the first bias power supplying terminal 13 and the first bias power input terminal 15. In addition, the above-described size ratios substantially satisfy e/f=g/h=i/j.

With the above structures, the electric current transmitted from the second semiconductor chip 22 to the third semiconductor chip 24 is generally equal to the electric current transmitted from the first semiconductor chip 20 to the second semiconductor chip 22. Thus, the first semiconductor chip 20 of embodiment 2 is used as a master chip, and a plurality of semiconductor chips having the same structure as that of the second semiconductor chip 22 are cascade-connected and used as slave chips, whereby the screen size of a display panel is increased while a variation in the output currents among the semiconductor chips is suppressed.

Furthermore, according to the current driver of embodiment 2, the electric current input to the third current input MISFET 16 provided at the side of the second current supply section 17-1 is substantially equal to the electric current input to the fourth current input MISFET 25 provided at the side of the second current supply section **17-*m*. Thus, a variation among the output currents in the second semiconductor chip 22** is suppressed.

In a display device including semiconductor chips of the present invention, a portion between a bias power supplying terminal of a semiconductor chip and a bias power input terminal of the next semiconductor chip may be in a high impedance state, and thus, a capacitor may be provided in this portion. Providing this capacitor is preferable because it helps reduction of noise.

Embodiment 3

Figure 4:
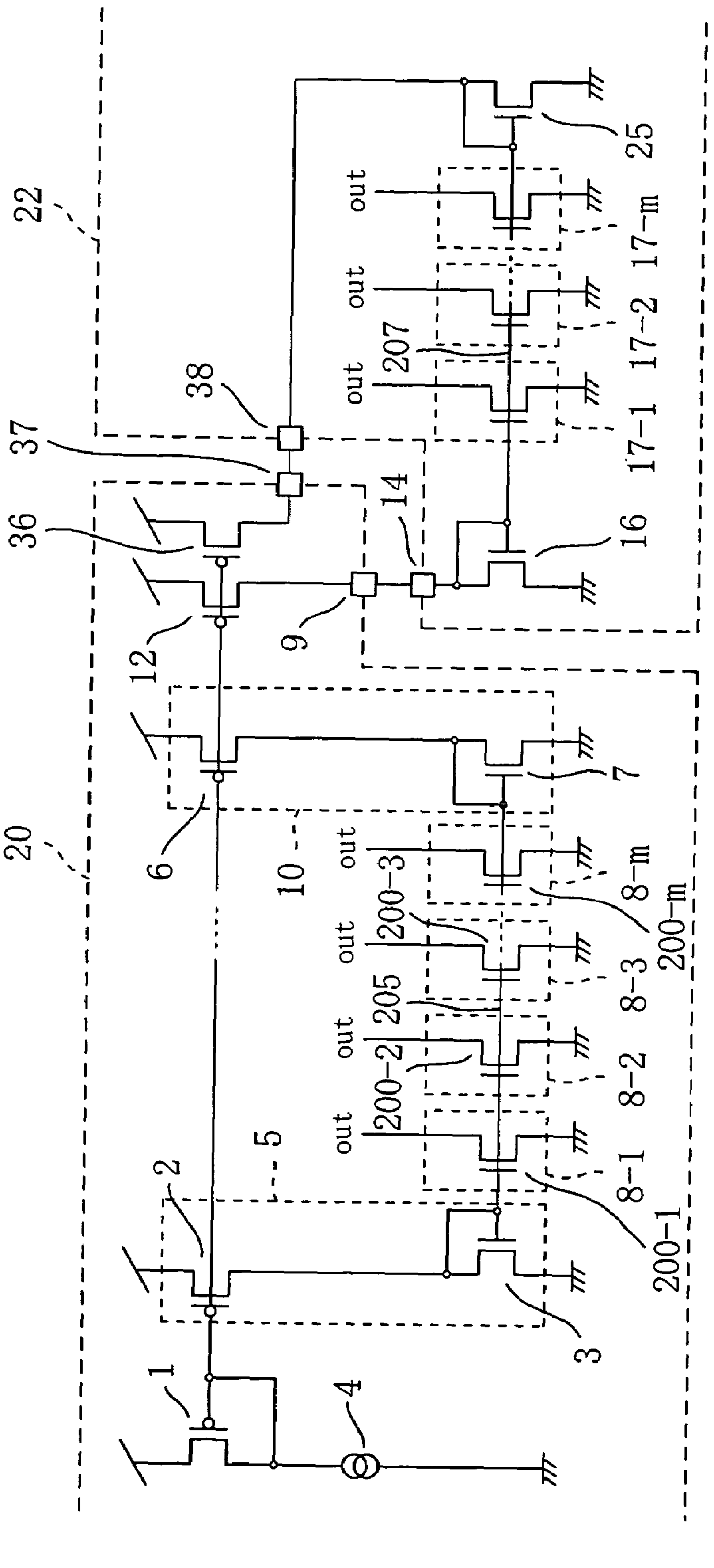
FIG. 4 is a circuit diagram showing semiconductor chips which include current drivers according to embodiment 3 of the present invention.

FIG. 4 is a circuit diagram showing semiconductor chips which include current drivers according to embodiment 3 of the present invention. In FIG. 4, a first current driver is provided on a first semiconductor chip 20, and a second current driver is provided on a second semiconductor chip 22.

The first and second current drivers of embodiment 3 are variations of the current drivers of embodiment 1. Hereinafter, differences in the first and second current drivers between embodiment 3 and embodiment 1 are described.

The first current driver of embodiment 3 includes, in addition to the components of the first current driver of embodiment 1, a sixth current distribution MISFET (additional current distribution MISFET) 36 of p-channel type and a third current output terminal 37 which is connected to the drain of the sixth current distribution MISFET 36. The gate electrode of the sixth current distribution MISFET 36 is connected to the first current distribution MISFET 12. The sixth current distribution MISFET 36 and the first MISFET 1 constitute a current mirror circuit. The sixth current distribution MISFET 36 is provided in the vicinity of the third current distribution MISFET 6 and the first current distribution MISFET 12. Specifically, the allowable range of the distance from the sixth current distribution MISFET 36 to the third current distribution MISFET 6 and the first current distribution MISFET 12 is equal to or shorter than 200 μm. Preferably, the distance is equal to or shorter than 100 μm.

The second current driver of embodiment 3 includes, in addition to the components of the second current driver of embodiment 1, a third current input terminal 38 which is connected to the third current output terminal 37 and a fourth current input MISFET 25 of n-channel type. The gate electrode and drain of the fourth current input MISFET 25 are connected to each other. The drain of the fourth current input MISFET 25 is connected to the third current input terminal 38. The gate electrode of the fourth current input MISFET 25 is connected to the second bias line 207. The fourth current input MISFET 25 and the third current input MISFET 16, interposing the second current supply sections 17-1, 17-2, . . . and **17-*m* between them, constitute a current mirror circuit. The second current driver is designed such that the value of k/l, where k is the W/L ratio of the sixth current distribution MISFET 36 and l is the W/L ratio of the fourth current input MISFET 25, is equal to the ratio of e/f, where e is the W/L ratio of the first current distribution MISFET 12 and f is the W/L ratio of the third current input MISFET 16. Furthermore, the condition of a/b=c/d=k/l is satisfied, where a is the W/L ratio of the second current distribution MISFET 2, b is the W/L ratio of the first current input MISFET 3, c is the W/L ratio of the third current distribution MISFET 6, and d is the W/L ratio of the second current input MISFET 7**.

In the above structure, an electric current is transmitted from the sixth current distribution MISFET 36 provided on the first semiconductor chip 20 to the second semiconductor chip 22. A uniform electric current is input to the second current supply sections 17 by the third current input MISFET 16 and the fourth current input MISFET 25 as compared with a case that the sixth current distribution MISFET 36 is provided on the second semiconductor chip 22. The electric currents input to the fourth current input MISFET 25, the first current input MISFET 3, and the second current input MISFET 7 are more equal as compared with a conventional current driver. Thus, according to the current driver of embodiment 3, an error in the output currents between semiconductor chips is small as compared with the conventional current drivers.

In addition, equal currents are input to the third current input MISFET 16 and the sixth current distribution MISFET 36 provided at the sides of the second current source MISFETs 201 (see FIG. 2), which constitute a current mirror circuit. Therefore, an error in the output currents from the second current supply sections 17 provided on the second semiconductor chip 22 is small.

In the example illustrated in FIG. 4, two semiconductor chips are provided side-by-side. However, according to the present invention, three or more semiconductor chips may be provided in a line. In such a case, it is only necessary to provide current distribution MISFETs in the vicinity of the first current distribution MISFET 12 (200 μm or closer), the number of which is equal to the number of slave chips cascade-connected to a master chip. However, an area on a semiconductor chip in which the current distributor chips can be provided is limited. Therefore, the structure of embodiment 3 is not much suitable for a display device which requires a large number of semiconductor chips. Thus, a current driver of embodiment 3 is preferably used in a device having a small panel, such as cellular mobile phones, PDAs, and the like.

Embodiment 4

Figure 5:
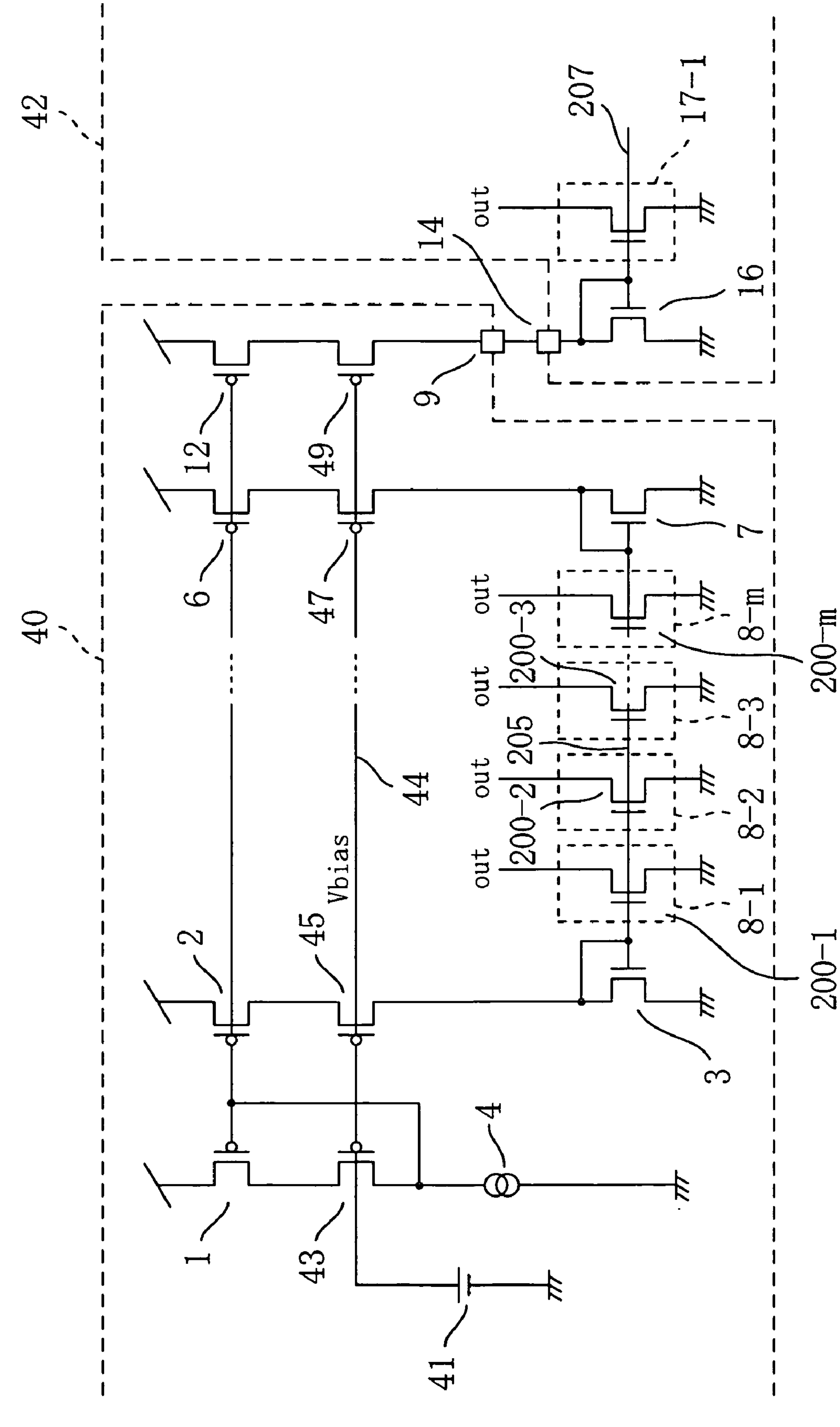
FIG. 5 is a circuit diagram showing semiconductor chips which include current drivers according to embodiment 4 of the present invention.

FIG. 5 is a circuit diagram showing semiconductor chips which include current drivers according to embodiment 4 of the present invention. The current driver of embodiment 4 includes, in addition to the components of the current driver of embodiment 1, means for stabilizing electric currents which are to be supplied to corresponding current input MISFETs. In the first current driver and the second current driver of embodiment 4, which are provided on the first semiconductor chip 40 and the second semiconductor chip 42, respectively, like elements are denoted by like reference numerals used in FIG. 2 of embodiment 1.

The first current driver of embodiment 4 includes, in addition to the components of the first current driver of embodiment 1, a first cascode MISFET 43 of p-channel type which is provided between the first MISFET 1 and the first current source 4, a second cascode MISFET 45 of p-channel type which is provided between the second current distribution MISFET 2 and the first current input MISFET 3, a third cascode MISFET 47 of p-channel type which is provided between the third current distribution MISFET 6 and the second current input MISFET 7, a fourth cascode MISFET 49 which is provided between the first current distribution MISFET 12 and the first current output terminal 9, and a first gate bias line 44. The source of the first cascode MISFET 43 is connected to the gate electrode of the first MISFET 1. One end of the first gate bias line 44 is connected to a first constant-voltage power supply 41. The first gate bias line 44 is also commonly connected to the gate electrodes of the first cascode MISFET 43, the second cascode MISFET 45, the third cascode MISFET 47 and the fourth cascode MISFET 49. The output voltage of the first constant-voltage power supply 41 is, for example, 4 V. The supply voltage of the first current driver is, for example, 5 V. The size of each cascode MISFET can be smaller than the size of each current distribution MISFET.

As described above, in the first current driver of embodiment 4, MISFETs are provided so as to be cascode-connected to the drain side of the current distribution MISFETs which constitute a current mirror circuit, whereby a variation among the drain voltages of the current distribution MISFETs is suppressed, and the constant-current characteristic is improved. In a display device using a current driver of embodiment 4, the value of the electric current flowing through the first current source 4 is sometimes changed according to the display brightness. Using the current driver of embodiment 4 makes it more sure that a predetermined electric current flows through the respective current input MISFETs even when the value of the electric current flowing through the first current source 4 is changed. Thus, it is possible to provide a display device with improved display quality by using a current driver of embodiment 4.

The above-described cascode MISFETs produce the equivalent effects even when provided in any of embodiments 1–3. It should be noted that, in such a case, the operation range of the MISFETs is narrower, and therefore, it is necessary to consider a balance between improvement of display quality and enhancement of design flexibility.

Embodiment 5

Figure 6:
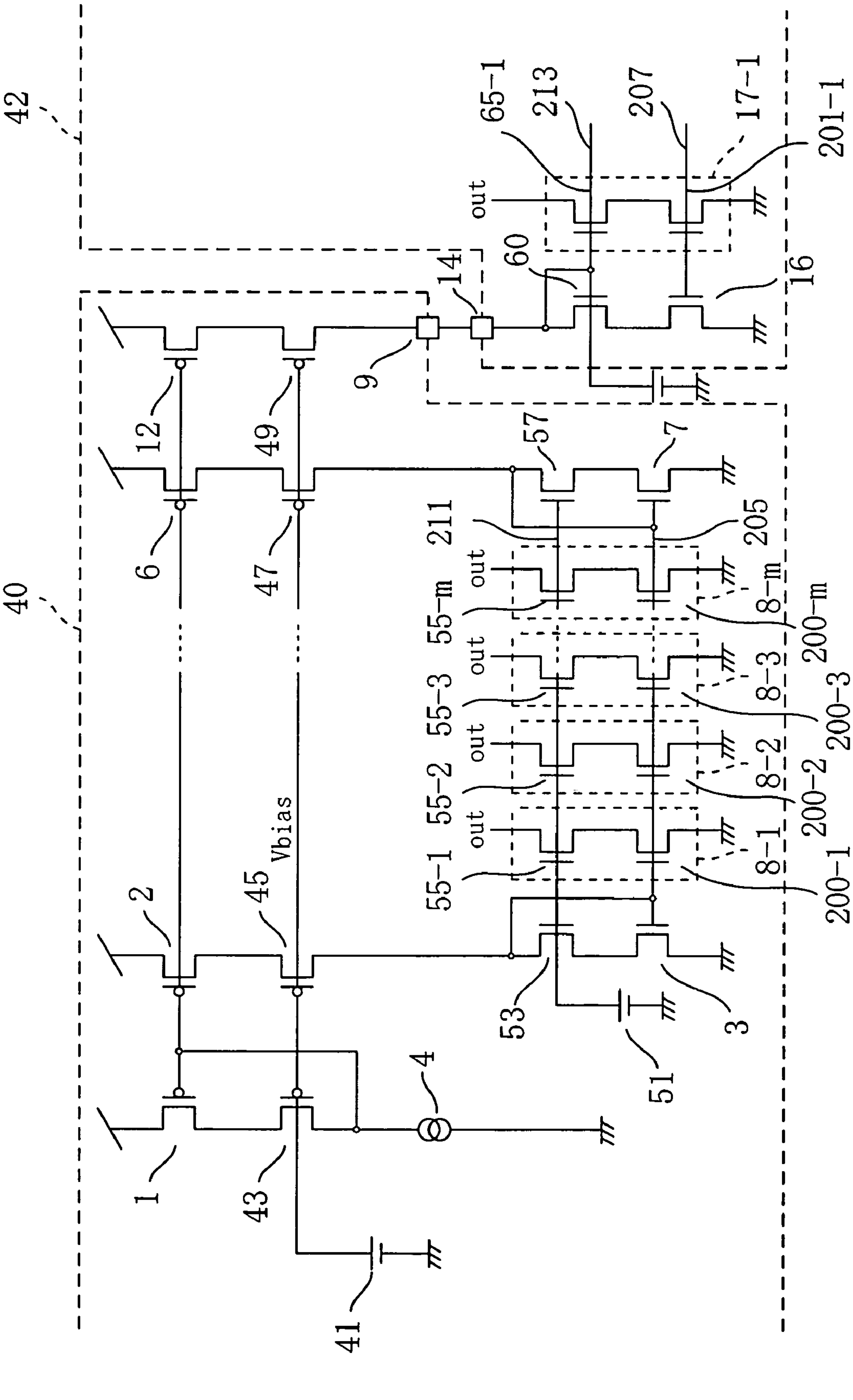
FIG. 6 is a circuit diagram showing semiconductor chips which include current drivers according to embodiment 5 of the present invention.

FIG. 6 is a circuit diagram showing semiconductor chips which include current drivers according to embodiment 5 of the present invention. The current driver of embodiment 5 is different from the current driver of embodiment 4 in that fifth cascode MISFETs 55-1, 55-2, . . . and **55-*m* of n-channel type are respectively connected to the drains of first current source MISFETs 200-1, 200-2, . . . and 200-*m* included in first current supply sections 8-1, 8-2, . . . and 8-*m*. Further, a sixth cascode MISFET 53 and a seventh cascode MISFET 57 are connected to the drain of the first current input MISFET 3 and the drain of the second current input MISFET 7, respectively. The gate electrodes of the fifth cascode MISFETs 55-1, 55-2, . . . and 55-*m*, the sixth cascode MISFET 53, and the seventh cascode MISFET 57 are commonly connected to a second gate bias line 211. One end of the second gate bias line 211 is connected to a second constant-voltage power supply 51** whose output voltage is about 1 V.

The second current driver of embodiment 5 includes, in addition to the components of the second current driver of embodiment 4, an eighth cascode MISFET 60 which is provided between the first current input terminal 14 and the third current input MISFET 16, and ninth cascode MISFETs 65-1, 65-2, . . . and **65-*m* which are respectively connected to the drains of the second current source MISFETs 201-1, 201-2, . . . and 201-*m*. The gate electrode of the eighth cascode MISFET 60 and the gate electrodes of the ninth cascode MISFETs 65-1, 65-2, . . . and 65-*m* are commonly connected to a third gate bias line 213. One end of the third gate bias line 213** is also connected to a constant-voltage power supply of about 1 V.

With the above structure, a variation among the drain voltages of the first current source MISFETs 200 and a variation among the drain voltages of the second current source MISFETs 201 are suppressed. Thus, the output currents from the first current supply sections 8 and the second current supply sections 17 are stable even when the display brightness in the display panel is changed, for example.

It should be noted that, although cascode MISFETs are connected to the current distribution MISFETs in the example of FIG. 6, the cascode MISFETs may be omitted.

Embodiment 6

Figure 7:
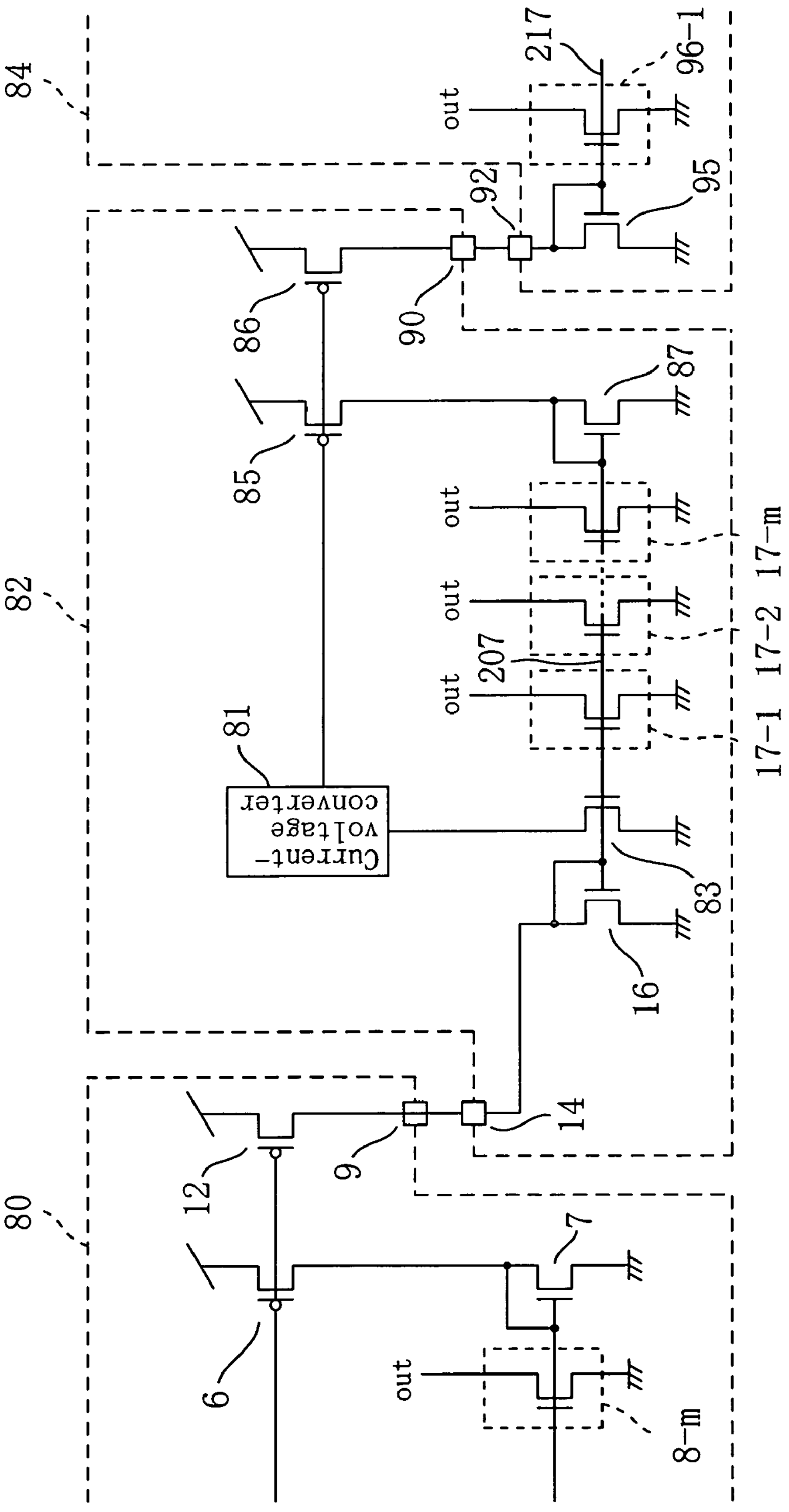
FIG. 7 is a circuit diagram showing semiconductor chips which include current drivers according to embodiment 6 of the present invention.

FIG. 7 is a circuit diagram showing semiconductor chips which include current drivers according to embodiment 6 of the present invention. Among the semiconductor chips shown in FIG. 7, a first semiconductor chip 80 is the same as the first semiconductor chip 20 of embodiment 1 (see FIG. 1), and therefore, the description below is mainly directed to a second semiconductor chip 82.

In FIG. 7, a first current driver is provided on the first semiconductor chip 80. A second current driver is provided on the second semiconductor chip 82. A third current driver is provided on the third semiconductor chip 84.

The second current driver of embodiment 6 includes, as does the second current driver of embodiment 1, a first current input terminal 14 connected to the first current output terminal 9, a third current input MISFET 16 of n-channel type, and second current supply sections 17 which include second current source MISFETs 201. The drain and gate electrode of the third current input MISFET 16 are commonly connected to a first current input terminal 14 and a second bias line 207. The source of the third current input MISFET 16 is grounded. The gate electrodes of the second current source MISFETs 201 are commonly connected to the second bias line 207.

The second current driver of embodiment 6 includes, in addition to the above components, a first current output MISFET 83 of n-channel type, a first current-voltage converter 81 which is connected to the drain of the first current output MISFET 83, seventh and eighth current distribution MISFETs 85 and 86 of p-channel type, a sixth current input MISFET 87, and a fourth current output terminal 90 which is connected to the drain of the eighth current distribution MISFET 86. The first current output MISFET 83, the third current input MISFET 16, the second current source MISFETs 201 (see FIG. 2) and the sixth current input MISFET 87 constitute a current mirror circuit. The gate electrodes of the seventh and eighth current distribution MISFETs 85 and 86 are connected to the first current-voltage converter 81. The drain and gate electrode of the sixth current input MISFET 87 are connected to each other. The sixth current input MISFET 87 and the third current input MISFET 16, interposing the second current supply sections 17 between them, constitute a current mirror circuit. The drain of the sixth current input MISFET 87 is connected to the seventh current distribution MISFET 85. A voltage obtained by converting an electric current flowing between the first current-voltage converter 81 and the first current output MISFET 83 is supplied from the first current-voltage converter 81 to the gate electrodes of the seventh and eighth current distribution-MISFETs 85 and 86.

The radio e/f, where e is the W/L ratio of the first current distribution MISFET 12 and f is the W/L ratio of the third current input MISFET 16, is equal to the radio c/d, where c is the W/L ratio of the third current distribution MISFET 6 and d is the W/L ratio of the second current input MISFET 7. Further, the ratio between the W/L ratio of the seventh current distribution MISFET 85 and the W/L ratio of the sixth current input MISFET 87 and the ratio between the W/L ratio of the eighth current distribution MISFET 86 and a seventh current input MISFET 95 are equal to the values of e/f and c/f, respectively.

The second current driver of embodiment 6 is different from that of embodiment 1 in that an electric current input from the first semiconductor chip 80 is distributed to the sixth current input MISFET 87, which is provided in the vicinity of the second current supply section 17-*m*, through the first current output MISFET 83, the first current-voltage converter 81, and the seventh current distribution MISFET 85. With such a structure, substantially equal electric currents are input at the ends of the second bias line 207. Thus, the output currents from the second current supply sections 17 are uniform as compared with the second current driver of embodiment 1.

In the second electric current of embodiment 6, the capacitance of a line which connects the gate electrodes of the current distribution MISFETs is small as compared with the second current driver of embodiment 2. Thus, noise is unlikely to occur.

In the second current driver of embodiment 6, the number of terminals is smaller than that in the second current driver of embodiment 2. Thus, the second current driver of embodiment 6 is readily mounted.

In addition to the above advantages, in a display device including the first semiconductor chip 80 and the second semiconductor chip 82, an error in the output current which occurs at a connecting portion between the first semiconductor chip 80 and the second semiconductor chip 82 is small as compared with a conventional display device. Thus, more uniform display of images is realized.

In the first current driver of embodiment 1, resistors having the same resistance value may be provided on the first bias line 205 between the gate electrode of the first current input MISFET 3 and the first current source MISFET 200-1, between the gate electrode of neighboring first current source MISFETs 200, and between the gate electrodes of the first current source MISFET 200-*m* and the second current input MISFET 7. In this case, it is preferable that resistors are also provided on the second bias line 207 in the same fashion.

Specific Example of the First Current-Voltage Converter

Figure 8:
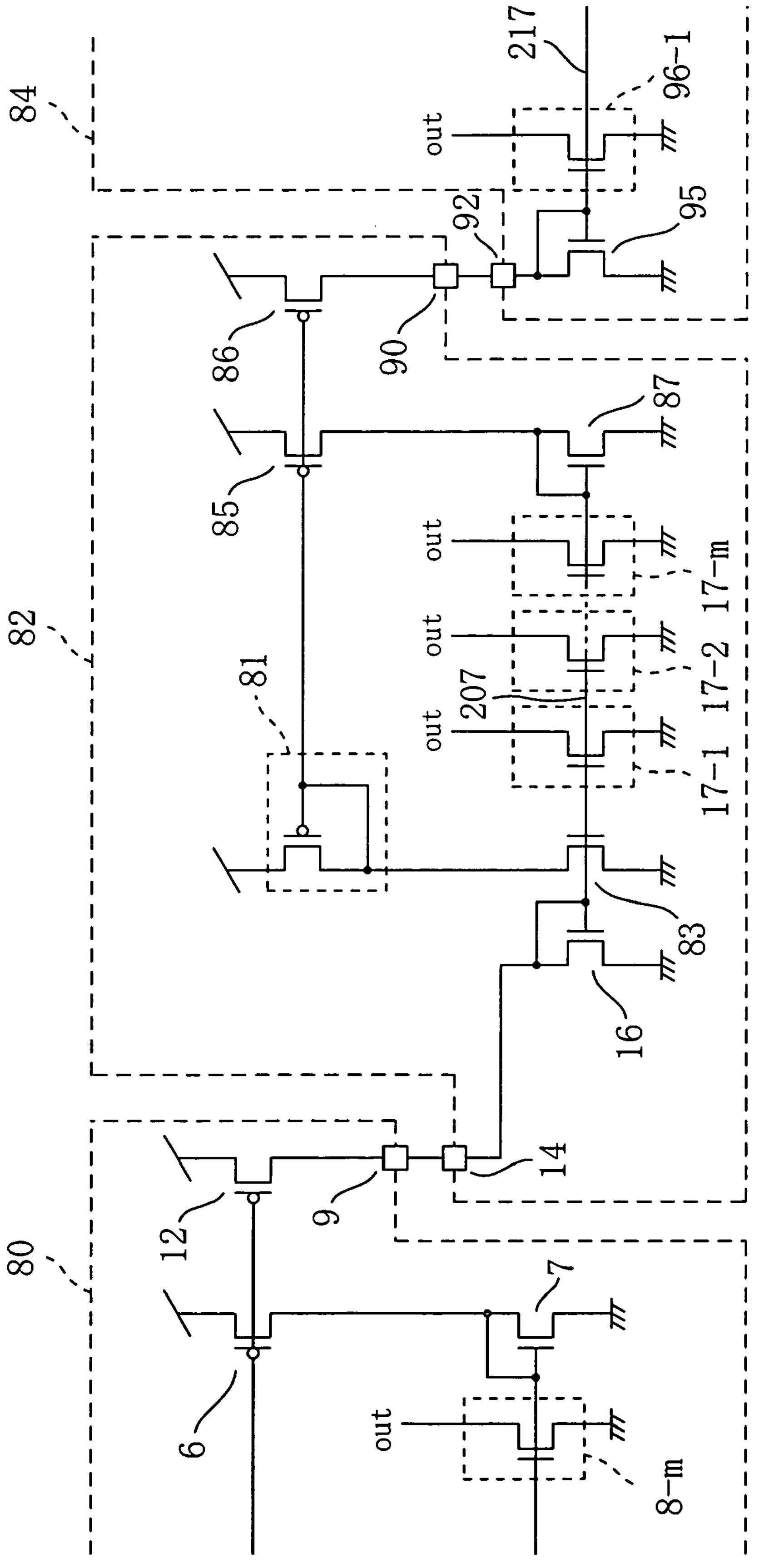
FIG. 8 is a circuit diagram showing a specific example of a first current-voltage converter in the semiconductor chip of embodiment 6 shown n FIG. 7.

FIG. 8 is a circuit diagram showing a specific example of the first current-voltage converter in the semiconductor chip of embodiment 6 shown n FIG. 7.

Referring to FIG. 8, an example of the first current-voltage converter 81 is a p-channel type MISFET. The drain of the p-channel type MISFET is connected to the first current output MISFET 83. The gate electrode of the p-channel type MISFET is connected to the gate electrodes of the seventh and eighth current distribution MISFETs 85 and 86. The gate electrode and drain of the p-channel type MISFET are connected to each other. The p-channel type MISFET and the seventh and eighth current distribution MISFETs 85 and 86 constitute a current mirror circuit. Thus, an electric current input from the first semiconductor chip 80 is distributed to the eighth current distribution MISFET 86 and a semiconductor chip of the next stage (third semiconductor chip 84).

Alternatively, a resistor connected to the supply voltage may be used as the first current-voltage converter 81. For example, a first resistor, one end of which is connected to the supply voltage, and a second resistor which intervenes between the first resistor and the first current output MISFET 83 are provided. The gate bias lines of the seventh and eighth current distribution MISFETs 85 and 86 are connected between the first resistor and the second resistor. With this structure, an input current is converted to a voltage.

In the second current driver of embodiment 6, the ratio between the W/L ratio of the eighth current distribution MISFET 86 and the W/L ratio of the third current input MISFET 16 is preferably equal to the ratio between the W/L ratio of the seventh current distribution MISFET 85 and the W/L ratio of the sixth current input MISFET 87. With this arrangement, in the case where a large number of second semiconductor chips 82 are cascode-connected as slave chips, a variation in the output currents among the semiconductor chips is suppressed.

Embodiment 7

Figure 9:
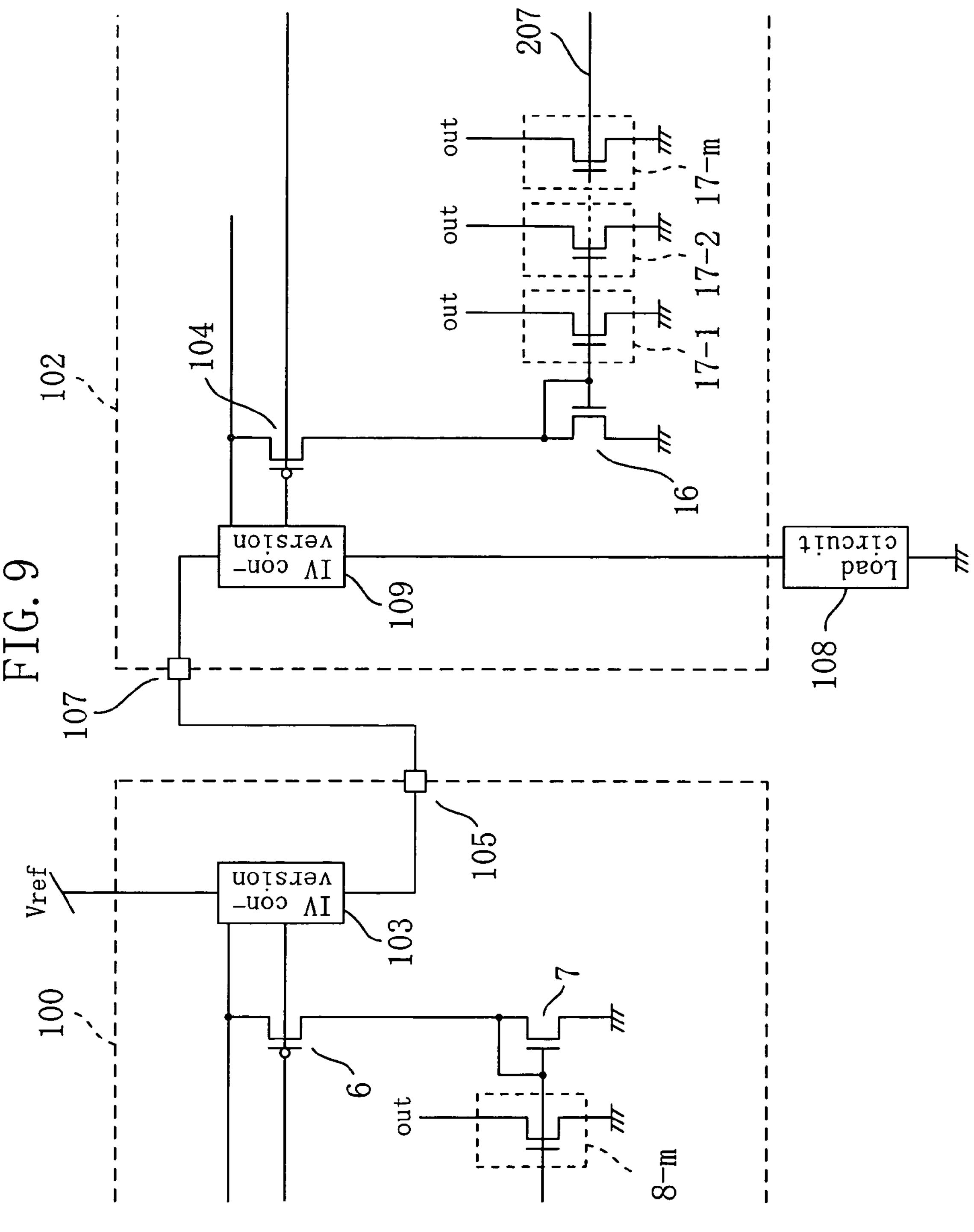
FIG. 9 is a circuit diagram showing semiconductor chips which include current drivers according to embodiment 7 of the present invention.

FIG. 9 is a circuit diagram showing semiconductor chips which include current drivers according to embodiment 7 of the present invention. Referring to FIG. 9, according to embodiment 7, current sources are provided in a current-driven display device for allowing equivalent electric currents to flow through a first semiconductor chip 100 and a second semiconductor chip 102 which are adjacent to each other. Also herein, a first current driver is integrated on the first semiconductor chip 100, and a second current driver is integrated on the second semiconductor chip 102. Hereinafter, the descriptions of components which are the same as those of embodiment 1 are omitted.

In embodiment 7, as shown in FIG. 9, the first current driver includes a second current-voltage converter (second IV converter) 103, which is connected to the gate electrode of the third current distribution MISFET 6 and to reference power supply Vref provided outside the chip 100, and a fourth current output terminal 105 which is connected to the second current-voltage converter 103. The second current-voltage converter 103 converts an input current to a voltage and applies the voltage to the gate electrode of the third current distribution MISFET 6. The second current-voltage converter 103 is connected to the source of the third current distribution MISFET 6. It should be noted that, although not shown, the second current-voltage converter 103 is also connected to the gate electrodes and sources of current distribution MISFETs.

The second current driver of embodiment 7 includes a fourth current input terminal 107 which is connected to the fourth current output terminal 105, a third current-voltage converter 109 which is connected in series to the second current-voltage converter 103 and reference power supply Vref through the fourth current input terminal 107, a ninth current distribution MISFET 104, and a third current input MISFET 16 of n-channel type which is connected to the drain of the ninth current distribution MISFET 104. A voltage obtained by conversion in the third current-voltage converter 109 is applied to the gate electrode of the ninth current distribution MISFET 104. The source of the ninth current distribution MISFET 104 is connected to the third current-voltage converter 109. The third current-voltage converter 109 is connected to a first load circuit 108 which is provided outside the chip 102. It should be noted that, although not shown, the third current-voltage converter 109 is also connected to the gate electrodes and sources of current distribution MISFETs.

In a display device including the current drivers of embodiment 7, the second current-voltage converter 103, the third current-voltage converter 109 and the first load circuit 108 are connected in series, such that substantially equal currents flow through the second current-voltage converter 103 and the third current-voltage converter 109. Thus, the output currents from current supply sections which exist in the vicinity of a connecting portion between the first semiconductor chip 100 and the second semiconductor chip 102 are equal.

In the case that it is desired that the electric current input to the second current input MISFET 7 and the electric current input to the third current input MISFET 16 are equal to each other, it is preferable that both the distance between the second current-voltage converter 103 and the third current distribution MISFET 6 and the distance between the third current-voltage converter 109 and the ninth current distribution MISFET 104 are short. These distances vary according to the semiconductor chip design but only need to be equal to or shorter than 200 μm.

It is preferable that the value of the electric current flowing from the fourth current output terminal 105 to the fourth current input terminal 107 is much smaller than the value of the electric current flowing through the gate electrode and source of the third current distribution MISFET 6 or the value of an electric current flowing through the gate electrode and source of the ninth current distribution MISFET 104 because, in such a case, equal electric currents flow at the ends of the two chips.

A specific example of the second current-voltage converter 103 and the third current-voltage converter 109 is a p-channel type MISFET whose gate electrode and drain are connected to each other, as in the specific example of FIG. 8. Alternatively, a resistor, a buffer, or the like, may be used as the current-voltage converter. When a resistor is used, the electric current which flows from the fourth current output terminal 105 to the fourth current input terminal 107 needs to be especially very small.

In embodiment 7, reference power supply Vref is connected to the second current-voltage converter 103, and the first load circuit 108 is connected to the fourth current input terminal 107. However, reference power supply Vref may be connected to the fourth current input terminal 107, and the first load circuit 108 may be connected to the second current-voltage converter 103.

Embodiment 8

Figure 10:
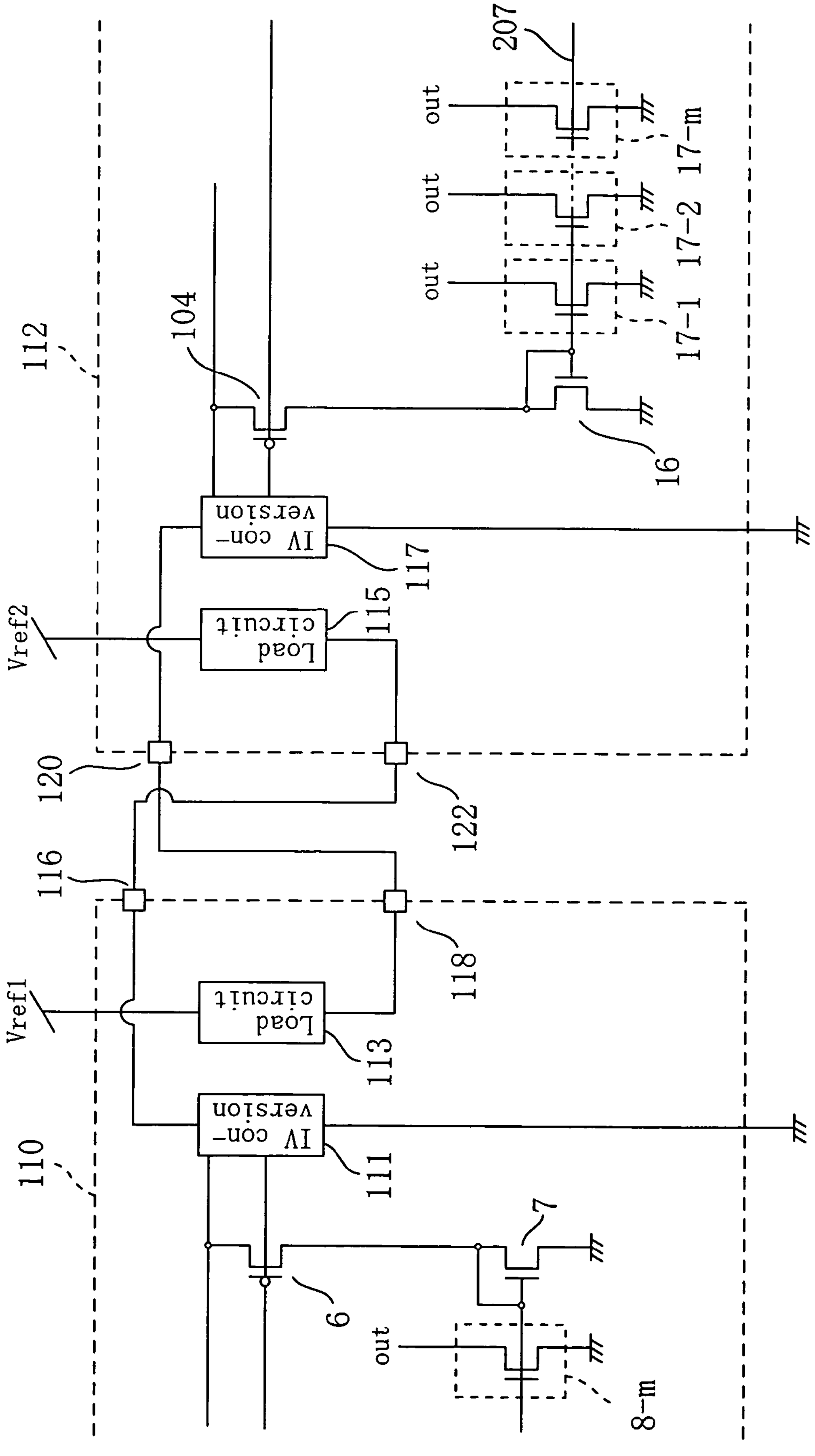
FIG. 10 is a circuit diagram showing semiconductor chips which include current drivers according to embodiment 8 of the present invention.

FIG. 10 is a circuit diagram showing semiconductor chips which include current drivers according to embodiment 8 of the present invention. Hereinafter, only differences of the current drivers of embodiment 8 from the current drivers of embodiment 7 are described.

As shown in FIG. 10, two current sources, each consisting of a current-voltage converter and a load circuit which are connected in series, are respectively provided on a first semiconductor chip 110 and a second semiconductor chip 112 which are provided adjacent to each other. The description below starts with the structure of each semiconductor chip.

The first current driver provided on the first semiconductor chip 110 includes a fourth current-voltage converter (fourth IV converter) 111 which is connected to the gate electrode and source of the third current distribution MISFET 6 and to the ground, a fifth current input terminal 116 connected to the fourth current-voltage converter 111, a second load circuit 113 provided in the vicinity of the fourth current-voltage converter 111, a fifth current output terminal 118 which is connected to the second load circuit 113.

The second current driver provided on the second semiconductor chip 112 includes a sixth current input terminal 120 which is connected to the fifth current output terminal 118, a fifth current-voltage converter 117 which is connected to the sixth current input terminal 120 and the gate electrode and source of the ninth current distribution MISFET 104, a third load circuit 115 which is connected to second reference power supply Vref2, and a sixth current output terminal 122 which is connected to the third load circuit 115 and the fifth current input terminal 116. The third load circuit 115 is provided in the vicinity of the fifth current-voltage converter 117. The voltage supplied from first reference power supply Vref1 is equal to the voltage supplied from second reference power supply Vref2.

With the above structure, in a condition that the first current driver and the second current driver are connected to each other, equal electric currents flow with high accuracy through the fifth current-voltage converter 117 which is connected in series to the second load circuit 113 and the fourth current-voltage converter 111 which is connected in series to the third load circuit 115.

The load circuits and current-voltage converters may be formed by devices provided on the semiconductor chips, such as MISFETs, as will be described later. This is because electric currents flow from the second load circuit 113 provided on the first semiconductor chip 110 to the fifth current-voltage converter 117 provided on the second semiconductor chip 112 and from the third load circuit 115 provided on the second semiconductor chip 112 to the fourth current-voltage converter 111 provided on the first semiconductor chip 110, and therefore, variations in the characteristics among chips are reduced.

Thus, in a display device having a structure of the first semiconductor chip 110 and the second semiconductor chip 112 of embodiment 8, the magnitudes of the electric currents for driving a panel are precisely equal at a connecting portion between adjoining chips, and accordingly, display unevenness is unlikely to be observed by an eye.

Both the distance between the fourth current-voltage converter 111 and the second load circuit 113 and the distance between the third load circuit 115 and the fifth current-voltage converter 117 are preferably equal to or shorter than 200 μm and are more preferably equal to or shorter than 100 μm.

By using the above-described semiconductor chips which includes the load circuits and current-voltage converters at the longitudinal ends, a large screen panel can be driven with three or more cascade-connected semiconductor chips.

Specific Example of Current-Voltage Converter and Load Circuit

Figure 11:
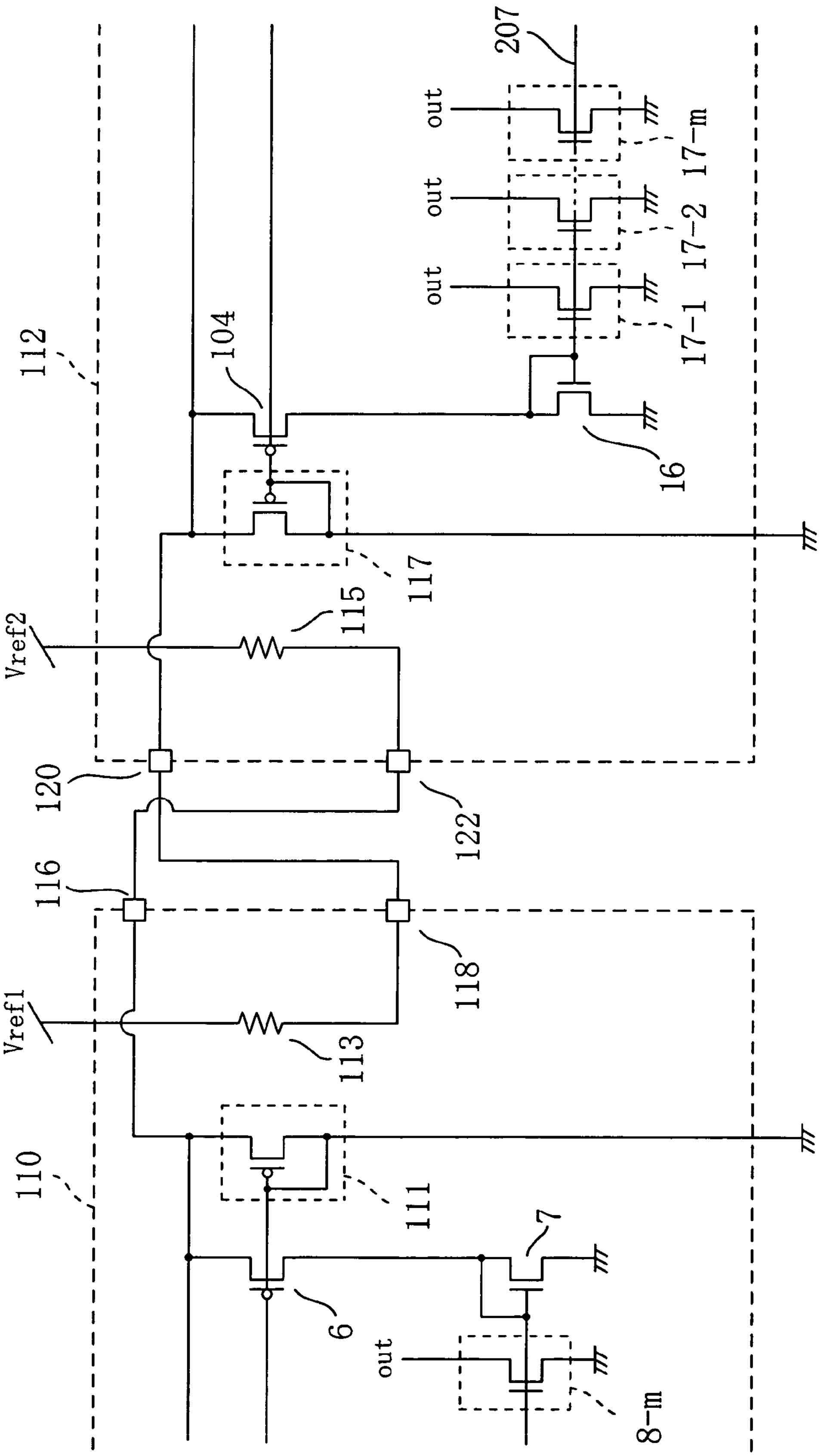
FIG. 11 is a circuit diagram showing a specific example of a current-voltage converter and a load circuit in the current driver of embodiment 8 shown n FIG. 10.
Figure 12:
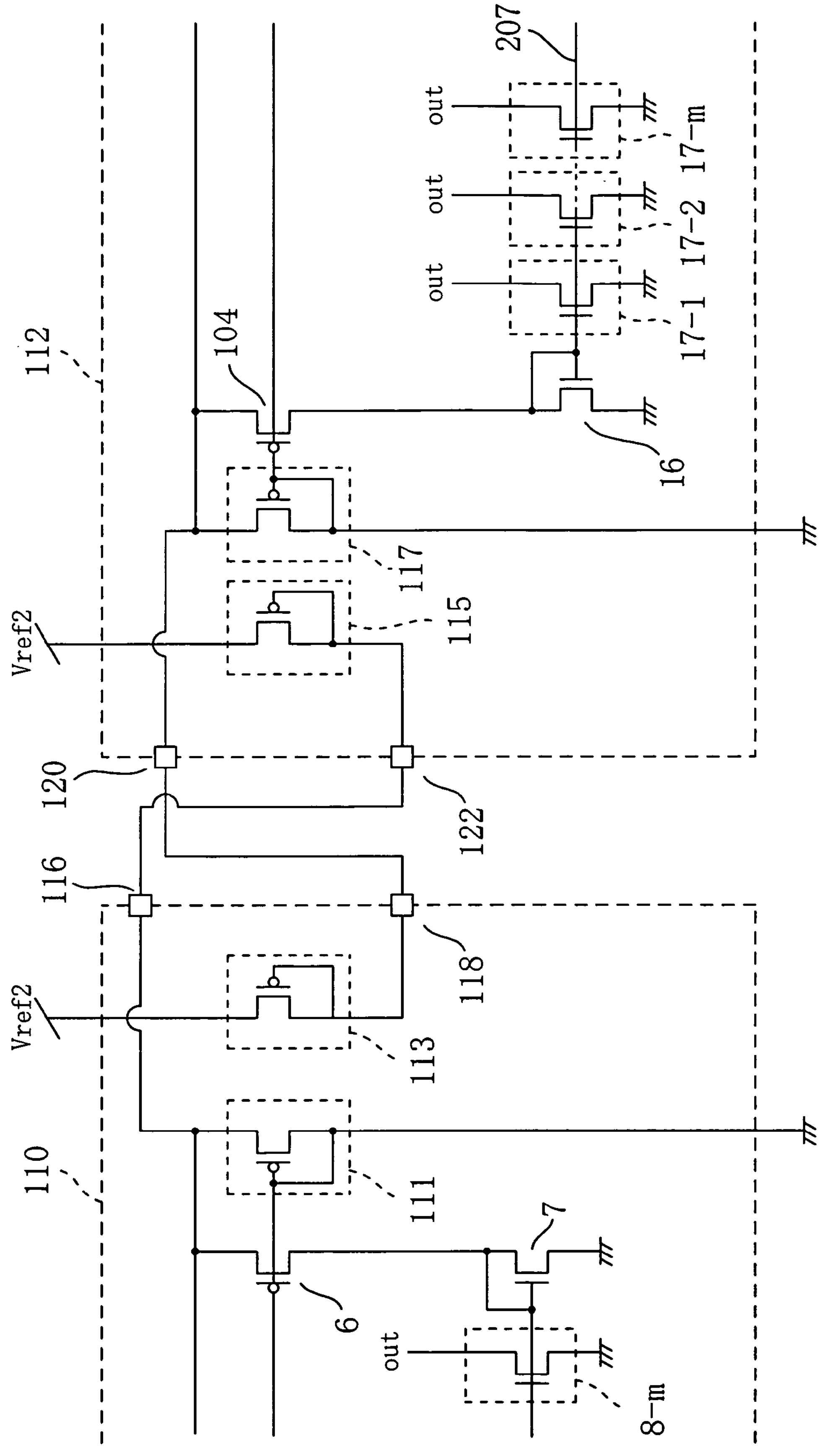
FIG. 12 is a circuit diagram showing another specific example of a current-voltage converter and a load circuit in the current driver of embodiment 8 shown n FIG. 10.

FIGS. 11 and 12 illustrate specific examples of a current-voltage converter and a load circuit in the current drivers of embodiment 8 shown n FIG. 10.

In the example illustrated in FIG. 11, a current-voltage converter is a MISFET whose drain and gate electrode are connected to each other, and a load circuit is a resistor made of polysilicon, or the like. In this case, as a matter of course, the fourth current-voltage converter 111 and the fifth current-voltage converter 117 need to be designed so as to have the same size and electrical characteristics. Further, the second load circuit 113 and the third load circuit 115 also need to have suitable characteristics, such as a suitable resistance value, and the like.

In the example illustrated in FIG. 12, both current-voltage converters and load circuits are formed by MISFETs whose drain and gate are connected to each other. In this case, the load circuits and current-voltage converters can be formed at the step of forming the other MISFETs, and therefore, the production thereof is easy as compared with a case that the load circuits are formed by resistors.

Embodiment 9

Figure 13:
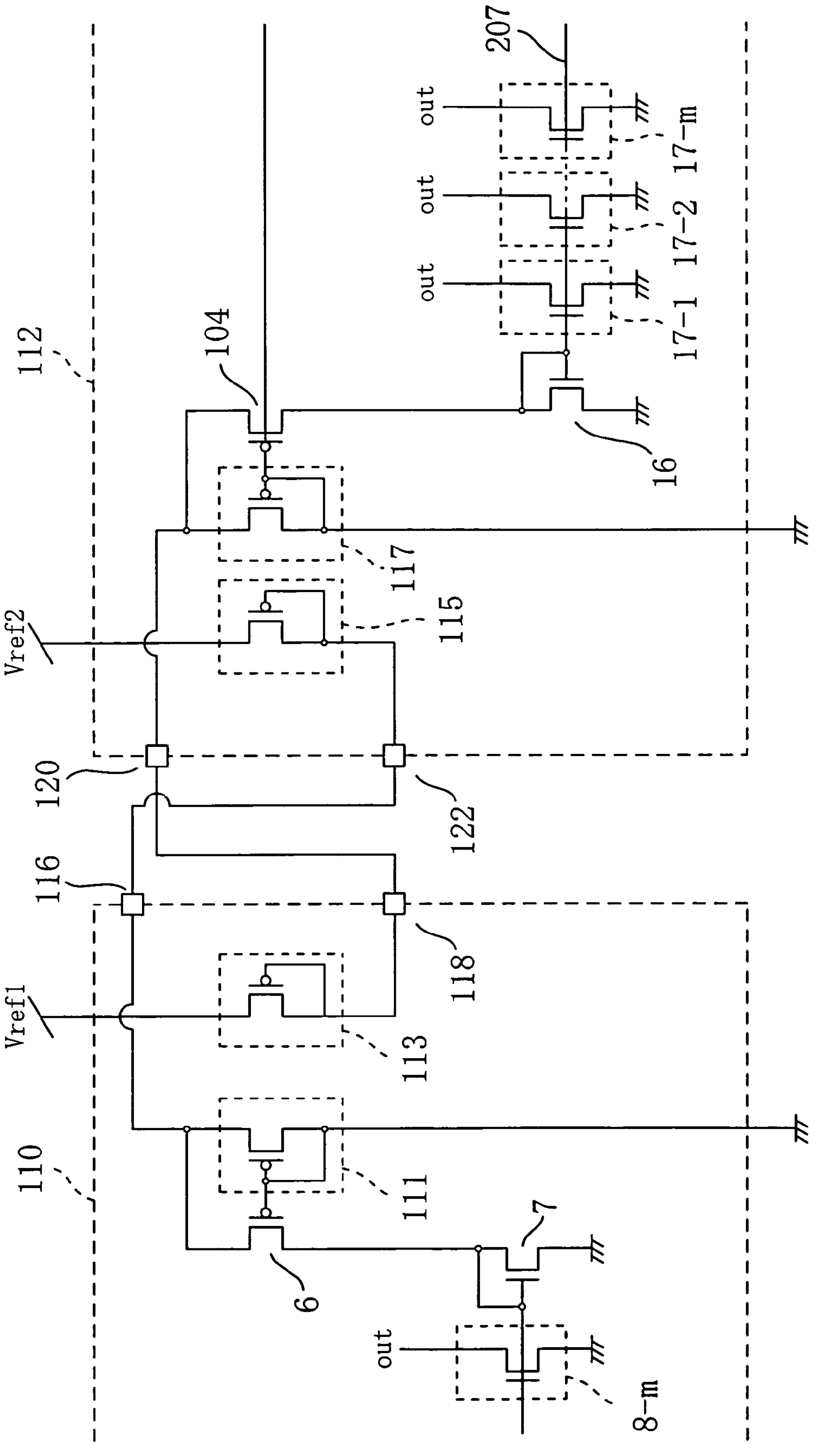
FIG. 13 is a circuit diagram showing semiconductor chips which include current drivers according to embodiment 9 of the present invention.

FIG. 13 is a circuit diagram showing semiconductor chips which include current drivers according to embodiment 9 of the present invention.

Referring to FIG. 13, the first and second current drivers of embodiment 9 include the same current-voltage converters and load circuits as those of the first and second current drivers shown in FIG. 12. In the current drivers of embodiment 9, an electric current to be transmitted to a current source MISFET which constitute a current mirror in a current supply section is input only from one current input MISFET.

Even with such a structure, the output currents in the vicinity of a connecting portion of adjoining semiconductor chips are uniform.

It should be noted that the current-voltage converters and load circuits may be resistors or buffers.

What is claimed is:

1. A current driver integrated on a semiconductor chip, comprising:

a first current distribution MISFET of a first conductivity type, a source of the first current distribution MISFET being supplied with a supply voltage;

a first current input MISFET of a second conductivity type, a drain of the first current input MISFET being electrically connected to a drain of the first current distribution MISFET, the drain and a gate electrode of the first current input MISFET being electrically connected to each other;

a second current input MISFET of the second conductivity type, a gate electrode of the second current input MISFET being electrically connected to the gate electrode of the first current input MISFET, a drain and the gate electrode of the second current input MISFET being electrically connected to each other;

a plurality of current supply sections each including a current source MISFET of the second conductivity type, electrodes of a plurality of current source MISFETs of the plurality of current supply sections being electrically connected to the gate electrodes of the first and second current input MISFETs;

a second current distribution MISFET of the first conductivity type, a gate electrode of the second current distribution MISFET being electrically connected to a gate electrode of the first current distribution MISFET, a drain of the second current distribution MISFET being electrically connected to the drain of the second current input MISFET;

a third current distribution MISFET of the first conductivity type provided adjacent to the second current distribution MISFET, a gate electrode of the third current distribution MISFET being electrically connected to the gate electrodes of the first current distribution MISFET and the second current distribution MISFET; and a first current output terminal being electrically connected to a drain of the third current distribution MISFET.

2. The current driver of claim 1, wherein a distance between the second current distribution MISFET and the third current distribution MISFET is equal to or shorter than 200 um.

3. The current driver of claim 1, further comprising a bias power supplying terminal being electrically connected to the gate electrode of the second current distribution MISFET and the gate electrode of the third current distribution MISFET.

4. The current driver of claim 1, further comprising:

an additional current distribution MISFET of the first conductivity type provided in a region of the semiconductor chip which is distant from the third current distribution MISFET by 200 um or less, a gate electrode of the additional current distribution MISFET being electrically connected to the gate electrodes of the second current distribution MISFET and the third current distribution MISFET; and an additional current output terminal being electrically connected to a drain of the additional current distribution MISFET.

5. The current driver of claim 1, further comprising:

a first cascode MISFET of the first conductivity type which is provided between the first current distribution MISFET and the first current input MISFET;

a second cascode MISFET of the first conductivity type which is provided between the second current distribution MISFET and the second current input MISFET;

a third cascode MISFET of the first conductivity type which is provided between the third current distribution MISFET and the first current output terminal; and a first gate bias line being electrically connected to gate electrodes of the first cascode MISFET, the second cascode MISFET and the third cascode MISFET, one end of the first gate bias line being electrically connected to a node supplying a first constant-voltage power supply.

6. The current driver of claim 1, further comprising:

a fourth cascode MISFET of the second conductivity type which is provided between the first current distribution MISFET and the first current input MISFET, a drain of the fourth cascode MISFET being electrically connected to the gate electrode of the first current input MISFET;

a fifth cascode MISFET of the second conductivity type which is provided between the second current distribution MISFET and the second current input MISFET, a drain of the fifth cascode MISFET being electrically connected to the gate electrode of the second current input MISFET;

a plurality of sixth cascode MISFETs of the second conductivity type, each of the plurality of sixth cascode MISFETs being electrically connected to each drain of each of the plurality of current source MISFETs of the plurality of current supply sections; and a second gate bias line being electrically connected to gate electrodes of the fourth cascode MISFET, the fifth cascode MISFET and the plurality of sixth cascode MISFETs, one end of the second gate bias line being electrically connected to a node supplying a second constant-voltage power supply.

7. A current driver integrated on a semiconductor chip, comprising:

a first current input terminal;

a first current input MISFET of a first conductivity type, a drain of the first current input MISFET being electrically connected to the first current input terminal, and the drain and a gate electrode of the first current input MISFET being electrically connected to each other;

a plurality of current supply sections each including a current source MISFET of the first conductivity type, each gate electrode of a plurality of current source MISFETs of the plurality of current supply sections being electrically connected to the gate electrode of the first current input MISFET;

a second current input MISFET of the first conductivity type, a drain and a gate electrode of the second current input MISFET being electrically connected to each other, the gate electrode of the second current input MISFET being electrically connected to the gate electrode of the first current input MISFET;

a bias power input tenninal;

a first current distribution MISFET of a second conductivity type, a gate electrode of the first current distribution MISFET being electrically connected to the bias power input terminal, a drain of the first current distribution MISFET being electrically connected to the drain of the second current input MISFET;

a second current distribution MISFET of the second conductivity type provided in a region of the semiconductor chip which is distant from the first current distribution MISFET by 200 um or less, a gate electrode of the second current distribution MISFET being electrically connected to the gate electrode of the first current distribution MISFET;

a first current output terminal being electrically connected to a drain of the second current distribution MISFET; and a first bias power output terminal being electrically connected to the gate electrode of the second current distribution MISFET.

8. A current driver integrated on a semiconductor chip, comprising:

a first current input terminal;

a first current input MISFET of a first conductivity type, a drain of the first current input MISFET being electrically connected to the first current input terminal, and the drain and a gate electrode of the first current input MISFET being electrically connected to each other;

a plurality of current supply sections each including a current source MISFET of the first conductivity type, each gate electrode of a plurality of current source MISFETs of the plurality of current supply sections being electrically connected to the gate electrode of the first current input MISFET;

a second current input MISFET of the first conductivity type, a drain and a gate electrode of the second current input MISFET being electrically connected to each other, the gate electrode of the second current input MISFET being electrically connected to the gate electrode of the first current input MISFET; and a second current input terminal being electrically connected to the drain of the second current input MISFET.

9. A current driver integrated on a semiconductor chip, comprising:

a first current input terminal;

a first current input MISFET of a first conductivity type, a drain of the first current input MISFET being electrically connected to the first current input terminal, and the drain and a gate electrode of the first current input MISFET being electrically connected to each other;

a plurality of current supply sections each including a current source MISFET of the first conductivity type, each gate electrode of a plurality of current source MISFETs of the plurality of current supply sections being electrically connected to the gate electrode of the first current input MISFET;

a current output MISFET of the first conductivity type, a gate electrode of the current output MISFET being electrically connected to the gate electrode of the first current input MISFET and the gate electrodes of the plurality of current source MISFETs;

a first current distribution MISFET of a second conductivity type, a drain and a gate electrode of the first current distribution MISFET being electrically connected to each other, the drain of the first current distribution MISFET being electrically connected to a drain of the current output MISFET;

a second current input MISFET of the first conductivity type, a drain and a gate electrode of the second current input MISFET being electrically connected to each other, the gate electrode of the second current input MISFET being electrically connected to the gate electrode of the first current input MISFET;

a second current distribution MISFET of the second conductivity, a gate electrode of the second current distribution MISFET being electrically connected to the gate electrode of the first current distribution MISFET and a drain of the second current distribution MISFET being electrically connected to the drain of the second current input MISFET;

a third current distribution MISFET of the second conductivity provided in a region of the semiconductor chip which is distant from the second current distribution MISFET by 200 um or less, a gate electrode of the third current distribution MISFET being electrically connected to the gate electrode of the second current distribution MISFET; and a first current output terminal being electrically connected to a drain of the third current distribution MISFET.

10. A current driver integrated on a semiconductor chip, comprising:

a first current distribution MISFET of a first conductivity type;

a first current input MISFET of a second conductivity type, a drain of the first current input MISFET being electrically connected to a drain of the first current distribution MISFET, the drain and a gate electrode of the first current input MISFET being electrically connected to each other;

a second current input MISFET of the second conductivity type, a gate electrode of the second current input MISFET being electrically connected to the gate electrode of the first current input MISFET, a drain and the gate electrode of the second current input MISFET being electrically connected to each other;

a plurality of current supply sections each including a current source MISFET of the second conductivity type, a plurality of current source MISFETs of the plurality of current supply sections being between the first current input MISFET and second current input MISFET and gate electrodes of the plurality of current source MISFETs being electrically connected to the gate electrodes of the first and second current input MISFETs;

a second current distribution MISFET of the first conductivity type, a gate electrode of the second current distribution MISFET being electrically connected to a gate electrode of the first current distribution MISFET, a drain of the second current distribution MISFET being electrically connected to the drain of the second current input MISFET;

a third current distribution MISFET of the first conductivity type, a gate electrode of the third current distribution MISFET being electrically connected to the gate electrodes of the first current distribution MISFET and the second current distribution MISFET; and a first current output terminal being electrically connected to a drain of the third current distribution MISFET.

11. The current driver of claim 10, wherein the plurality of current source MISFETs of the plurality of current supply sections are formed in a region between the first current input MISFET and second current input MISFET.

12. The current driver of claim 10, wherein the plurality of current source MISFETs of the plurality of current supply sections are formed in a region extending between the first current input MISFET and second current input MISFET.

13. The current driver of claim 10, wherein a distance between the second current distribution MISFET and the third current distribution MISFET is equal to or shorter than 200 um.

14. The current driver of claim 10, further comprising:

a bias power supplying terminal being electrically connected to the gate electrode of the second current distribution MISFET and the gate electrode of the third current distribution MISFET.

15. The current driver of claim 10, further comprising:

an additional current distribution MISFET of the first conductivity type, a gate electrode of the additional current distribution MISFET being electrically connected to the gate electrodes of the second current distribution MISFET and the third current distribution MISFET; and an additional current output terminal being electrically connected to a drain of the additional current distribution MISFET.

16. The current driver of claim 10, further comprising:

a first cascode MISFET of the first conductivity type being provided between the first current distribution MISFET and the first current input MISFET;

a second cascode MISFET of the first conductivity type being provided between the second current distribution MISFET and the second current input MISFET;

a third cascode MISFET of the first conductivity type being provided between the third current distribution MISFET and the first current output terminal, wherein gate electrodes of the first cascode MISFET, the second cascode MISFET and the third cascode MISFET are electrically connected to a node supplying a first constant-voltage power supply.

17. The current driver of claim 10, further comprising:

a fourth cascode MISFET of the second conductivity type being provided between the first current distribution MISFET and the first current input MISFET, a drain of the fourth cascode MISFET being electrically connected to the gate electrode of the first current input MISFET;

a fifth cascode MISFET of the second conductivity type being provided between the second current distribution MISFET and the second current input MISFET, a drain of the fifth cascode MISFET being electrically connected to the gate electrode of the second current input MISFET;

a plurality of sixth cascode MISFETs of the second conductivity type, each of the plurality of sixth cascode MISFETs being electrically connected to each drain of the plurality of current source MISFETs, wherein gate electrodes of the fourth cascode MISFET, the fifth cascode MISFET and the plurality of sixth cascode MISFETs are electrically connected a node supplying to a second constant-voltage power supply.

18. A current driver integrated on a semiconductor chip, comprising:

a first current input terminal;

a first current input MISFET of a first conductivity type, a drain of the first current input MISFET being electrically connected to the first current input terminal, and the drain and a gate electrode of the first current input MISFET being electrically connected to each other;

a second current input MISFET of the first conductivity type, a drain and a gate electrode of the second current input MISFET being electrically connected to each other, the gate electrode of the second current input MISFET being electrically connected to the gate electrode of the first current input MISFET;

a plurality of current supply sections each including a current source MISFET of the first conductivity type, a plurality of current source MISFETs of the plurality of current supply sections being between the first current input MISFET and the second current input MISFET and each gate electrode of the plurality of current source MISFETs being electrically connected to the gate electrodes of the first and second current input MISFETs;

a bias power input terminal;

a first current distribution MISFET of a second conductivity type, a gate electrode of the first current distribution MISFET being electrically connected to the bias power input terminal, a drain of the first current distribution MISFET being electrically connected to the drain of the second current input MISFET;

a second current distribution MISFET of the second conductivity type, a gate electrode of the second current distribution MISFET being electrically connected to the gate electrode of the first current distribution MISFET;

a first current output terminal being electrically connected to a drain of the second current distribution MISFET; and a first bias power output terminal being electrically connected to the gate electrode of the second current distribution MISFET.

19. The current driver of claim 18, wherein the plurality of current source MISFETs of the plurality of current supply sections are formed in a region between the first current input MISFET and second current input MISFET.

20. The current driver of claim 18, wherein the plurality of current source MISFETs of the plurality of current supply sections are formed in a region extending between the first current input MISFET and second current input MISFET.

21. A current driver integrated on a semiconductor chip, comprising:

a first current input terminal;

a first current input MISFET of a first conductivity type, a drain of the first current input MISFET being electrically connected to the first current input terminal, and the drain and a gate electrode of the first current input MISFET being electrically connected to each other;

a second current input MISFET of the first conductivity type, a drain and a gate electrode of the second current input MISFET being electrically connected to each other, the gate electrode of the second current input MISFET being electrically connected to the gate electrode of the first current input MISFET;

a plurality of current supply sections each including a current source MISFET of the first conductivity type, a plurality of current source MISFETs of the plurality of current supply sections being between the first current input MISFET and the second current input MISFET and each gate electrode of the plurality of current source MISFETs being electrically connected to the gate electrodes of the first and second current input MISFETs; and a second current input terminal being electrically connected to the drain of the second current input MISFET.

22. The current driver of claim 21, wherein the plurality of current source MISFETs of the plurality of current supply sections are formed in a region between the first current input MISFET and second current input MISFET.

23. The current driver of claim 21, wherein the plurality of current source MISFETs of the plurality of current supply sections are formed in a region extending between the first current input MISFET and second current input MISFET.

24. A current driver integrated on a semiconductor chip, comprising:

a first current input terminal;

a first current input MISFET of a first conductivity type, a drain of the first current input MISFET being electrically connected to the first current input terminal, and the drain and a gate electrode of the first current input MISFET being electrically connected to each other;

a second current input MISFET of the first conductivity type, a drain and a gate electrode of the second current input MISFET being electrically connected to each other, the gate electrode of the second current input MISFET being electrically connected to the gate electrode of the first current input MISFET;

a plurality of current supply sections each including a current source MISFET of the first conductivity type, a plurality of current source MISFETs of the plurality of current supply sections being between the first current input MISFET and the second current input MISFET and each gate electrode of the plurality of current source MISFETs being electrically connected to the gate electrodes of the first and second current input MISFETs;

a current output MISFET of the first conductivity type, a gate electrode of the current output MISFET being electrically connected to the gate electrodes of the first and second current input MISFETs and the gate electrodes of the plurality of current source MISFETs;

a first current distribution MISFET of a second conductivity type, a drain and a gate electrode of the first current distribution MISFET being electrically connected to each other, the drain of the first current distribution MISFET being electrically connected to a drain of the current output MISFET;

a second current distribution MISFET of the second conductivity type, a gate electrode of the second current distribution MISFET being electrically connected to the gate electrode of the first current distribution MISFET and a drain of the second current distribution MISFET being electrically connected to the drain of the second current input MISFET;

a third current distribution MISFET of the second conductivity type, a gate electrode of the third current distribution MISFET being electrically connected to the gate electrodes of the first and second current distribution MISFETs; and a first current output terminal being electrically connected to a drain of the third current distribution MISFET.

25. The current driver of claim 24, wherein the plurality of current source MISFETs of the plurality of current supply sections are formed in a region between the first current input MISFET and second current input MISFET.

26. The current driver of claim 24, wherein the plurality of current source MISFETs of the plurality of current supply sections are formed in a region extending between the first current input MISFET and second current input MISFET.

* * * * *